US006567951B2

(12) United States Patent
Senshu

(10) Patent No.: US 6,567,951 B2
(45) Date of Patent: *May 20, 2003

(54) OPTICAL DISC FORMAT EXHIBITING ROBUST ERROR CORRECTION CODING

(75) Inventor: Susumu Senshu, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/988,979

(22) Filed: Nov. 19, 2001

(65) Prior Publication Data

US 2002/0053050 A1 May 2, 2002

Related U.S. Application Data

(63) Continuation of application No. 09/249,748, filed on Feb. 12, 1999, now abandoned.

(30) Foreign Application Priority Data

Feb. 16, 1998 (JP) ............................................. 10-050084

(51) Int. Cl.[7] ........................ G11C 29/00; H03M 13/00
(52) U.S. Cl. ...................................... 714/769; 714/755
(58) Field of Search ................................. 714/769, 768, 714/755; 369/53.35

(56) References Cited

U.S. PATENT DOCUMENTS

| | | | | |
|---|---|---|---|---|
| 4,627,058 A | 12/1986 | Moriyama | .................... | 714/758 |
| 5,051,998 A | 9/1991 | Murai et al. | ................. | 714/758 |
| 5,112,324 A | 5/1992 | Howe et al. | ................ | 714/758 |
| 5,446,745 A | 8/1995 | Gibbs | .......................... | 714/758 |
| 5,592,450 A | 1/1997 | Yonemitsu et al. | ............ | 369/48 |
| 5,623,459 A | 4/1997 | Iwamura et al. | .............. | 369/32 |
| 5,712,838 A | 1/1998 | Inazawa et al. | ................ | 369/59 |
| 5,734,787 A | 3/1998 | Yonemitsu et al. | ......... | 386/111 |
| 5,757,752 A | 5/1998 | Sako | ............................ | 369/59 |
| 5,901,127 A | 5/1999 | Sako et al. | .................... | 369/59 |
| 5,920,578 A * | 7/1999 | Zook | ........................... | 714/755 |
| 5,948,117 A | 9/1999 | Weng et al. | ................. | 714/784 |
| 5,991,911 A * | 11/1999 | Zook | ........................... | 714/758 |
| 5,996,105 A | 11/1999 | Zook | ........................... | 714/755 |
| 6,048,090 A * | 4/2000 | Zook | ........................... | 714/755 |
| 6,223,322 B1 | 4/2001 | Michigami et al. | ......... | 714/769 |
| 6,349,400 B1 * | 2/2002 | Senshu | ....................... | 714/769 |

FOREIGN PATENT DOCUMENTS

| | | | |
|---|---|---|---|
| EP | 117-287 | 9/1984 | ................. 714/758 |
| EP | 0 798 712 A | 10/1997 | |

OTHER PUBLICATIONS

DVD Demystified—Taylor—McGraw Hill, pp. 120–135, Oct. 1997.
Patent Abstracts of Japan, vol. 17, No. 519 (P–1615), Sep. 17, 1993, JP 05 135503 Jun. 1, 1993.
K.A. Schouhamer Immink: "The Digital Versatile Disc (DVD): System Requirements and Channel Coding", SMPTE Journal, Aug. 1996, pp. 483–489, XP000627183.

\* cited by examiner

*Primary Examiner*—Albert Decady
*Assistant Examiner*—Joseph D. Torres
(74) *Attorney, Agent, or Firm*—Frommer Lawrence & Haug LLP; William S. Frommer; Glenn F. Savit

(57) ABSTRACT

An optical disc recording/reproducing method and apparatus employs a logical format that allows for long interleaving by a large block to thereby improve reliability of the recording/reproduction operation. Data is recorded/reproduced in accordance with a disc format in which an ECC block is formed by a first error correction code C1 interleaved with respect to the direction of data on the disc, and a second code C2 having a different data direction from that of the first error correction code. The ECC block is made up of one or more sectors, and an information word portion of the first error correction code in the ECC block encompasses the interleaved second code.

23 Claims, 38 Drawing Sheets

|  | 100 byte | | | | |
|---|---|---|---|---|---|
| segment 0 20 byte | segment 1 | | segment 4 | | sector frame |
| B(0,0,0,0)   B(0,0,0,19) | B(0,0,1,0) | | B(0,0,4,0)   B(0,0,4,19) | | 0   0 |
| B(0,1,0,0)   B(0,1,0,19) | B(0,1,1,0) | | B(0,1,4,0)   B(0,1,4,19) | | 0   1 |
|  |  |  |  |  | 2 |
|  |  |  |  |  | 3 |
|  |  |  |  | 4 | 4 |
|  |  |  |  |  | 5 |
|  |  |  |  |  | 44 |
|  |  |  |  |  | 15   45 |
| B(15,46,0,0)   B(15,46,0,19) | B(15,46,1,0) | | B(15,46,4,0)   B(15,46,4,19) | | 15   46 |

B(s,t,u,v)   s : sector
             t : frame
             u : segment
             v : byte

FIG.6A

|  | 1200 channel (+DCCC) | | | | |
|---|---|---|---|---|---|
| segment 0 240 channel (+DCCC) | segment 1 | | segment 4 | | sector frame |
| m(0,0,0,0)   m(0,0,0,239) | m(0,0,1,0) | | m(0,0,4,0)   m(0,0,4,239) | | 0   0 |
| m(0,1,0,0)   m(0,1,0,239) | m(0,1,1,0) | | m(0,1,4,0)   m(0,1,4,239) | | 0   1 |
|  |  |  |  |  | 2 |
|  |  |  |  |  | 3 |
|  |  |  |  |  | 4 |
|  |  |  |  |  | 5 |
|  |  |  |  |  | 44 |
|  |  |  |  |  | 15   45 |
| m(15,46,0,0)   m(15,46,0,239) | m(15,46,1,0) | | m(15,46,4,0)   m(15,46,4,239) | | 15   46 | m(s,t,u,v)   s : sector
             t : frame
             u : segment
             w : channel

FIG.6B

| APC | VFO | ←FS← | FRAME (channel) | →PO | sector | frame |
|---|---|---|---|---|---|---|
| APC | VFO | FS1 | m(0,0,0,0) | m(0,0,4,239) | | 0 | 0 |
| | | FS0 | m(0,0,0,0) | m(0,1,4,239) | | | 1 |
| | | | | | | | 2 |
| | | FS0 | | | | | 39 |
| | | FS0 | | | | | 40 |
| | | FS0 | | | | | 41 |
| | | FS0 | | | | | 42 |
| | | FS0 | | | | | 43 |
| | | FS0 | | | | | 44 |
| | | FS0 | m(0,45,0,0) | m(0,45,4,239) | | | 45 |
| | | FS0 | m(0,46,0,0) | m(0,46,4,239) | PO | | 46 |
| APC | VFO | FS1 | m(1,0,0,0) | m(1,0,4,239) | | 1 | 0 |
| | | FS0 | m(1,1,0,0) | m(1,1,4,239) | | | 1 |
| | | | | | | | 2 |
| | | FS0 | | | | | 39 |
| | | FS0 | | | | | 40 |
| | | FS0 | | | | | 41 |
| | | FS0 | | | | | 42 |
| | | FS0 | | | | | 43 |
| | | FS0 | | | | | 44 |
| | | FS0 | m(1,45,0,0) | m(1,45,4,239) | | | 45 |
| | | FS0 | m(1,46,0,0) | m(1,46,4,239) | PO | | 46 |
| APC | VFO | FS1 | m(2,0,0,0) | m(2,0,4,239) | | 2 | 0 |
| | | FS0 | m(2,1,0,0) | m(2,1,4,239) | | | 1 |
| | | | | | | | 2 |
| | | FS0 | | | | | 39 |
| | | FS0 | | | | | 40 |
| | | FS0 | | | | | 41 |
| | | FS0 | | | | | 42 |
| | | FS0 | | | | | 43 |
| | | FS0 | | | | | 44 |
| | | FS0 | m(14,45,0,0) | m(14,45,4,239) | | | 45 |
| | | FS0 | m(14,46,0,0) | m(14,46,4,239) | PO | | 46 |
| APC | VFO | FS1 | m(15,0,0,0) | m(15,0,4,239) | | 15 | 0 |
| | | FS0 | m(15,1,0,0) | m(15,1,4,239) | | | 1 |
| | | FS0 | | | | | 39 |
| | | FS0 | | | | | 40 |
| | | FS0 | | | | | 41 |
| | | FS0 | | | | | 42 |
| | | FS0 | | | | | 43 |
| | | FS0 | | | | | 44 |
| | | FS0 | m(15,45,0,0) | m(15,45,4,239) | | | 45 |
| | | FS0 | m(15,46,0,0) | m(15,46,4,239) | PO | | 46 |

FIG.7

| APC | VFO | ←FS← | FRAME (channel) | →PO | sector | frame |
|---|---|---|---|---|---|---|
| APC | VFO | FS1 | m(0,0,0,0) | m(0,0,4,239) | 0 | 0 |
| | | FS0 | m(0,0,0,0) | m(0,1,4,239) | | 1 |
| | | | | | | 2 |
| | | FS0 | | | | 39 |
| | | FS0 | | | | 40 |
| | | FS0 | | | | 41 |
| | | FS0 | | | | 42 |
| | | FS0 | | | | 43 |
| | | FS0 | | | | 44 |
| | | FS0 | m(0,45,0,0) | m(0,45,4,239) | | 45 |
| | | FS0 | m(0,46,0,0) | m(0,46,4,239) PO | | 46 |
| APC | VFO | FS1 | m(1,0,0,0) | m(1,0,4,239) | 1 | 0 |
| | | FS0 | m(1,1,0,0) | m(1,1,4,239) | | 1 |
| | | | | | | 2 |
| | | FS0 | | | | 39 |
| | | FS0 | | | | 40 |
| | | FS0 | | | | 41 |
| | | FS0 | | | | 42 |
| | | FS0 | | | | 43 |
| | | FS0 | | | | 44 |
| | | FS0 | m(1,45,0,0) | m(1,45,4,239) | | 45 |
| | | FS0 | m(1,46,0,0) | m(1,46,4,239) PO | | 46 |
| APC | VFO | FS1 | m(2,0,0,0) | m(2,0,4,239) | 2 | 0 |
| | | FS0 | m(2,1,0,0) | m(2,1,4,239) | | 1 |
| | | | | | | 2 |
| | | FS0 | | | | 39 |
| | | FS0 | | | | 40 |
| | | FS0 | | | | 41 |
| | | FS0 | | | | 42 |
| | | FS0 | | | | 43 |
| | | FS0 | | | | 44 |
| | | FS0 | m(14,45,0,0) | m(14,45,4,239) | | 45 |
| | | FS0 | m(14,46,0,0) | m(14,46,4,239) PO | | 46 |
| APC | VFO | FS1 | m(15,0,0,0) | m(15,0,4,239) | 15 | 0 |
| | | FS0 | m(15,1,0,0) | m(15,1,4,239) | | 1 |
| | | | | | | 2 |
| | | FS0 | | | | 39 |
| | | FS0 | | | | 40 |
| | | FS0 | | | | 41 |
| | | FS0 | | | | 42 |
| | | FS0 | | | | 43 |
| | | FS0 | | | | 44 |
| | | FS0 | m(15,45,0,0) | m(15,45,4,239) | | 45 |
| | | FS0 | m(15,46,0,0) | m(15,464,239) PO | | 46 |

|   | 10 (line) |   |
|---|---|---|
| B(x,0,0,0) | - | B(x,0,0,19) |
| B(x,0,1,0) | - | B(x,0,1,19) |
| B(x,0,2,0) | - | B(x,0,2,19) |
| B(x,0,3,0) | - | B(x,0,3,19) |
| B(x,0,4,0) | - | B(x,0,4,19) |
| B(x,1,0,0) | - | B(x,1,0,19) |
| B(x,1,1,0) | - | B(x,1,1,19) |
| B(x,1,2,0) | - | B(x,1,2,19) |

206 word (information word)

29 word (parity word)

| B(x,46,2,0) | - | B(x,46,2,19) |
| B(x,46,3,0) | - | B(x,46,3,19) |
| B(x,46,4,0) | - | B(x,46,4,19) |

|  | 50 byte | | | | sector | frame |
|---|---|---|---|---|---|---|
| segment 0<br>10 byte | | segment 1 | segment 4 | | | |
| B(0,0,0,0) | B(0,0,0,9) | B(0,0,1,0) | B(0,0,46,0) | B(0,0,46,9) | 0 | 0 |
| B(0,1,0,0) | B(0,1,0,9) | B(0,1,1,0) | B(0,1,46,0) | B(0,1,46,9) | 0 | 1 |
| | | | | | | 2 |
| | | | | | | 3 |
| | | | | | | 4 |
| | | | | | | 5 |
| | | | | | | 44 |
| | | | | | 31 | 45 |
| B(31,46,0,0) | B(31,46,0,9) | B(31,46,1,0) | B(31,46,4,0) | B(31,46,4,9) | 31 | 46 |

B(s,t,u,v)   s : sector
             t : frame
             u : segment
             v : byte

FIG.13B

|  | 600 channel (+DCCC) | | | | sector | frame |
|---|---|---|---|---|---|---|
| segment 0<br>120 channel (+DCCC) | | segment 1 | segment 4 | | | |
| m(0,0,0,0) | m(0,0,0,119) | m(0,0,1,0) | | m(0,0,46,119) | 0 | 0 |
| m(0,1,0,0) | m(0,1,0,119) | m(0,1,1,0) | m(0,1,46,0) | m(0,1,46,119) | 0 | 1 |
| | | | | | | 2 |
| | | | | | | 3 |
| | | | | | | 4 |
| | | | | | | 5 |
| | | | | | | 44 |
| | | | | | 31 | 45 |
| m(31,46,0,0) | m(31,46,0,119) | m(31,46,1,0) | m(31,46,4,0) | m(31,46,4,119) | 31 | 46 | m(s,t,u,v)   s : sector
             t : frame
             u : segment
             w : channel

| APC | VFO | ←FS← | FRAME (channel) | →PO | sector | frame |
|---|---|---|---|---|---|---|
| APC | VFO | FS1 | m(0,0,0,0) | m(0,0,4,119) | | 0 | 0 |
| | | FS0 | m(0,0,0,0) | m(0,1,4,119) | | | 1 |
| | | | | | | | 2 |
| | | FS0 | | | | | 39 |
| | | FS0 | | | | | 40 |
| | | FS0 | | | | | 41 |
| | | FS0 | | | | | 42 |
| | | FS0 | | | | | 43 |
| | | FS0 | | | | | 44 |
| | | FS0 | m(0,45,0,0) | m(0,45,4,119) | | | 45 |
| | | FS0 | m(0,46,0,0) | m(0,46,4,119) | PO | | 46 |
| APC | VFO | FS1 | m(1,0,0,0) | m(1,0,4,119) | | 1 | 0 |
| | | FS0 | m(1,1,0,0) | m(1,1,4,119) | | | 1 |
| | | | | | | | 2 |
| | | FS0 | | | | | 39 |
| | | FS0 | | | | | 40 |
| | | FS0 | | | | | 41 |
| | | FS0 | | | | | 42 |
| | | FS0 | | | | | 43 |
| | | FS0 | | | | | 44 |
| | | FS0 | m(1,45,0,0) | m(1,45,4,119) | | | 45 |
| | | FS0 | m(1,46,0,0) | m(1,46,4,119) | PO | | 46 |
| APC | VFO | FS1 | m(2,0,0,0) | m(2,0,4,119) | | 2 | 0 |
| | | FS0 | m(2,1,0,0) | m(2,1,4,119) | | | 1 |
| | | | | | | | 2 |
| | | FS0 | | | | | 39 |
| | | FS0 | | | | | 40 |
| | | FS0 | | | | | 41 |
| | | FS0 | | | | | 42 |
| | | FS0 | | | | | 43 |
| | | FS0 | | | | | 44 |
| | | FS0 | m(14,45,0,0) | m(14,45,4,119) | | | 45 |
| | | FS0 | m(14,46,0,0) | m(14,46,4,119) | PO | | 46 |
| APC | VFO | FS1 | m(15,0,0,0) | m(15,0,4,119) | | 31 | 0 |
| | | FS0 | m(15,1,0,0) | m(15,1,4,119) | | | 1 |
| | | FS0 | | | | | 39 |
| | | FS0 | | | | | 40 |
| | | FS0 | | | | | 41 |
| | | FS0 | | | | | 42 |
| | | FS0 | | | | | 43 |
| | | FS0 | | | | | 44 |
| | | FS0 | m(15,45,0,0) | m(15,45,4,119) | | | 45 |
| | | FS0 | m(15,46,0,0) | m(15,46,4,119) | PO | | 46 |

|  | 79 byte |  | sector | frame |
|---|---|---|---|---|
| B(0,0,0,0) |  | B(0,0,78,0) | 0 | 0 |
| B(0,1,0,0) |  | B(0,1,78,0) | 0 | 1 |
|  |  |  |  | 2 |
|  |  |  |  | 3 |
|  |  |  |  | 4 |
|  |  |  |  | 5 |
|  |  |  |  | 57 |
|  |  |  | 15 | 58 |
| B(15,59,0,0) |  | B(15,59,78,0) | 15 | 59 |

B(s,t,u,v)   s : sector
t : frame
u : segment
v : byte

FIG.25A

|  | 948 channel (+DCCC) |  | sector | frame |
|---|---|---|---|---|
| m(0,0,0,0) |  | m(0,0,78,11) | 0 | 0 |
| m(0,1,0,0) |  | m(0,1,78,11) | 0 | 1 |
|  |  |  |  | 2 |
|  |  |  |  | 3 |
|  |  |  |  | 4 |
|  |  |  |  | 5 |
|  |  |  |  | 57 |
|  |  |  | 15 | 58 |
| m(15,59,0,0) |  | m(15,59,78,11) | 15 | 59 | m(s,t,u,v)   s : sector
t : frame
u : segment
w : channel

FIG.25B

| APC | VFO | ←FS | ← FRAME (channel) | → | PO | sector | frame |
|---|---|---|---|---|---|---|---|
| APC | VFO | FS1 | m(0,0,0,0) | m(0,0,78,11) | | 0 | 0 |
| | | FS0 | m(0,1,0,0) | m(0,1,78,11) | | | 1 |
| | | | | | | | 2 |
| | | FS0 | | | | | 52 |
| | | FS0 | | | | | 53 |
| | | FS0 | | | | | 54 |
| | | FS0 | | | | | 55 |
| | | FS0 | | | | | 56 |
| | | FS0 | | | | | 57 |
| | | FS0 | m(0,58,0,0) | m(0,58,78,11) | | | 58 |
| | | FS0 | m(0,59,0,0) | m(0,59,78,11) | PO | | 59 |
| APC | VFO | FS1 | m(1,0,0,0) | m(1,0,78,11) | | 1 | 0 |
| | | FS0 | m(1,1,0,0) | m(1,1,78,11) | | | 1 |
| | | | | | | | 2 |
| | | FS0 | | | | | 52 |
| | | FS0 | | | | | 53 |
| | | FS0 | | | | | 54 |
| | | FS0 | | | | | 55 |
| | | FS0 | | | | | 56 |
| | | FS0 | | | | | 57 |
| | | FS0 | m(1,58,0,0) | m(1,58,78,11) | | | 58 |
| | | FS0 | m(1,59,0,0) | m(1,59,78,11) | PO | | 59 |
| APC | VFO | FS1 | m(2,0,0,0) | m(2,0,78,11) | | 2 | 0 |
| | | FS0 | m(2,1,0,0) | m(2,1,78,11) | | | 1 |
| | | | | | | | 2 |
| | | FS0 | | | | | 52 |
| | | FS0 | | | | | 53 |
| | | FS0 | | | | | 54 |
| | | FS0 | | | | | 55 |
| | | FS0 | | | | | 56 |
| | | FS0 | | | | | 57 |
| | | FS0 | m(14,58,0,0) | m(14,58,78,11) | | | 58 |
| | | FS0 | m(14,59,0,0) | m(14,59,78,11) | PO | | 59 |
| APC | VFO | FS1 | m(15,0,0,0) | m(15,0,78,11) | | 15 | 0 |
| | | FS0 | m(15,1,0,0) | m(15,1,78,11) | | | 1 |
| | | | | | | | 2 |
| | | FS0 | | | | | 52 |
| | | FS0 | | | | | 53 |
| | | FS0 | | | | | 54 |
| | | FS0 | | | | | 55 |
| | | FS0 | | | | | 56 |
| | | FS0 | | | | | 57 |
| | | FS0 | m(15,58,0,0) | m(15,58,78,11) | | | 58 |
| | | FS0 | m(15,59,0,0) | m(15,59,78,11) | PO | | 59 |

FIG.26

OPTICAL DISC FORMAT EXHIBITING ROBUST ERROR CORRECTION CODING

This application is a continuation of U.S. patent application Ser. No. 09/249,748, filed Feb. 12, 1999 now abandoned.

BACKGROUND OF THE INVENTION

1. Field of the Invention

This invention relates to an optical disc recording/reproducing method, an optical disc and to an optical disc device.

2. Description of the Related Art

Up to now, an optical recording medium, such as a disc-shaped recording medium or a card-shaped recording medium, employing an optical or magneto-optical signal recording/reproducing method, has been developed and offered to the market. Of these recording mediums, there are known read-only type recording mediums, such as the so-called compact discs, write-once type recording mediums on which the user can write only once, and an overwrite type recording mediums, on which the information can be rewritten, such as a magneto-optical disc.

An optical disc device for data writing/readout for a disc-shaped recording medium encloses a laser diode for radiating a light beam for information recording/reproduction and a photodetector for detecting the reflected light of the light beam illuminated on the optical disc and is adapted for recording/reproducing data by scanning the recording track of the optical disc with a light beam using an optical head focussing-servo or tracking-servo controlled, based on a detection output of the photodetector, as the speed servo is applied to the spindle motor to run the optical disc run in rotation at a constant angular velocity or at a constant linear velocity. It is noted that blocked codes are used in a magneto-optical disc system prescribed in International Organization for Standardization (ISO).

In the magneto-optical disc format, prescribed in ISO, the direction of user data is the data direction on a disc, as shown in FIG. 1. In an ECC block, employing the blocked code, the direction of the correction code is interleaved with reference to the data direction on the disc for elevating the burst error correction capability. In this format, data directly following the frame sync FS belongs to the same error correction code, the second data from the frame sync FS belongs to the separate same error correction code, and so forth until the data directly previous to the frame sync FS belongs to the still separate same error correction code.

If, during recording on this format of the optical disc, the totality of a sole ECC block of user data sent from the application side is written via an arbiter 301 on a buffer memory 302, an ECC processor 303 starts error correction coding. When the totality of data in the sole ECC block has been encoded, the encoded data is sent from the buffer memory 302 to modulation means to start channel encoding. It is this channel-encoded data that is recorded on the user data area on the disc.

Also, if during reproduction, the reproduced data obtained from the disc is channel-decoded by demodulation means so that the totality of a sole ECC block is written in the buffer memory 302 via arbiter 301, as shown in FIG. 2B, the ECC processor 303 starts decoding. When the totality of data within the sole ECC block has been decoded, user data is retrieved from the buffer memory 302 and sent to the application side.

Recently, the recording capacity of a read-only memory (ROM) disc or a random-access memory (RAM) by an optical recording medium is increasing drastically. As the wavelength of a semiconductor laser used for an optical head of an optical disc recording/reproducing apparatus is becoming shorter, attempts are made towards increasing the numerical aperture NA of an objective lens used for converging the light beam on an information recording surface of the optical disc.

As a technique for realizing a high density phase change type optical disc of a larger recording capacity exceeding the capacity of the DVD-RAM, there is known a method of reducing the spot size. The spot size on a recording medium, generally given by $\lambda$/NA, can be reduced by the technique of using a short wavelength semiconductor laser light source, such as GaN or ZnSe, or the technique of enlarging the NA of an objective lens by a double lens set exemplified by a solid immersion lens (SIL).

If, for example, a=640 nm and NA is 0.85, the spot diameter is approximately 0.75 $\mu$m on the recording medium, such that, if signals are recorded or reproduced using, for example, the RLL(1,7) modulation, the recording line density of the order of 0.21 $\mu$m/bit can be achieved.

As the representative modulation code of the modulation system of the broad channel detection window suited for high density recording/reproduction, there are known the RLL(1,7) code or the RLL(2,7) code.

In an optical disc system employing an optical head having an objective lens of high NA, it is necessary to elevate the error correction capability in order to combat errors ascribable to the dust and dirt affixed to or scratches on the optical disc surface. For elevating the error correction capability, the code or the ECC block is enlarged.

There is also proposed a method of bundling and blocking error correction codes by interleaving for enlarging the ECC block to a length equivalent to one track on the inner rim of the disc.

If the blocked code is used, the block size exceeding 64 kB as user data can be constructed even with the use of the GF($2^8$) routinely used as a code.

In the block structure known up to now, as shown in FIG. 3, the number of symbols of the C1 correction code and the C2 correction code is up to a maximum of 255 in the case of the product code (PRC) employing the GF($2^8$). The interleaving length is up to a maximum of 255+1 such that it cannot be extended limitlessly. Although the code length can be lengthened by limiting C1 only to the code for detection, C2 needs to be a correction code in order to effect error correction. Therefore, none of the C2 code, C1 code nor the interleaving length can be lengthened with a routine method.

On the other hand, if, with the ECC block structure of the DVD shown in FIG. 4, a large block is constituted, it is difficult to have the information word and the parity word distributed evenly in each sector, while it is difficult to have the sector ID in the information word arranged in each sector, to render the addressing in the ROM disc difficult.

SUMMARY OF THE INVENTION

It is therefore an object of the present invention to provide an optical disc recording/reproducing method, an optical disc and an optical disc device in which a logical format of a product code is constructed for enabling the long interleaving by a large block to enable data recording/reproduction to high reliability.

It is another object of the present invention to provide an optical disc recording/reproducing method, an optical disc and an optical disc device in which recording/reproduction of data of sufficiently high reliability for normal use is enabled at a high transfer rate.

It is another object of the present invention to provide an optical disc recording/reproducing method, an optical disc and an optical disc device in which data can be recorded/reproduced with plural logical formats having the same physical format and different block sizes.

According to the present invention, the error correction code C1 takes a line in the vertical direction, against the oblique data direction on the disc, as indicated by the data direction on the disc and the code direction (correction line) in FIG. 39, and the error correction code C1 is interleaved. A number of the interleaved error correction codes C1 are bundled to form an ECC block, on which a second code C2 having the data direction different from the error correction code C1 is constituted, as shown in FIG. 40.

In this ECC block, the data on the disc is in the oblique direction, while the interleaving direction with respect to the first error correction code C1 is in the horizontal direction, so that the interleaving length can be increased. Also, in this ECC block, a product code (PCR) can be constructed by having the second code C2 as the error correction code, thus assuring a high correction capability. Also, since the second code C2 in this ECC block has its direction coincident with the data direction on the disc, it is possible to start the encoding at a time point the data required for encoding one ECC block is readied and to record data on the disc at a time point when the encoding for one ECC block comes to a close. Also, during reproduction, it is possible to start the correcting operation for the playback data as from the time point when the data for one ECC block has been sent from the demodulator and to send out user data as from a time point the correction for one code comes to a close.

Specifically, the present invention provides, in one aspect, a recording/reproducing method for an optical disc in which data is recorded/reproduced by a disc format in which an ECC block formed by a first error correction code interleaved with respect to the direction of data on the disc and a second code having the direction of the data different from that of the first error correction code is made up of one or more sectors, the sector is made up of a plurality of sectors, the block length of the ECC block is set so that > block length=number of sectors×number of frames×frame length= code length×interleaving length;

the number of sub-sectors is set so that
  number of sub-sectors=number of sectors×p, where p is the number of segments which is a natural number;
  (code length×interleaving length)/(segment length× number of sub-sectors)% number of sub-sectors, where % denotes modulo, and the number of sub-sectors, are prime relative to each other, and in which
the number of data in the segment is smaller than the number of sectors in the frame, and the position of the code for correction is updated from segment to segment in associating the data position on the disc with the data position on the ECC block, as the interleaving rule is met. Data is recorded/reproduced by a disc format in which information word portion of the first error correction code in the ECC block is made up of interleaved second codes.

In another aspect, the present invention provides an optical disc having a disc format in which an ECC block formed by a first error correction code interleaved with respect to the direction of data on the disc and a second code having the direction of the data different from that of the first error correction code is made up of one or more sectors, the sector is made up of a plurality of sectors, the block length of the ECC block is set so that > block length=number of sectors×number of frames×frame length= code length×interleaving length;

the number of sub-sectors is set so that
  number of sub-sectors=number of sectors×p, where p is the number of segments which is a natural number;
  (code length×interleaving length)/(segment length× number of sub-sectors)% number of sub-sectors, where % denotes modulo, and the number of sub-sectors, are prime relative to each other;
the number of data in the segment is smaller than the number of sectors in the frame, and the position of the code for correction is updated from segment to segment in associating the data position on the disc with the data position on the ECC block, as the interleaving rule is met. The information word portion of the first error correction code in the ECC block is made up of interleaved second codes.

In yet another aspect, the present invention provides an optical disc device for recording/reproducing data by a disc format in which an ECC block formed by a first error correction code interleaved with respect to the direction of data on the disc and a second code having the direction of the data different from that of the first error correction code is made up of one or more sectors, the sector is made up of a plurality of sectors, the block length of the ECC block is set so that > block length=number of sectors×number of frames×frame length= code length×interleaving length;

the number of sub-sectors is set so that
  number of sub-sectors=number of sectors×p, where p is the number of segments which is a natural number;
  (code length×interleaving length)/(segment length× number of sub-sectors)% number of sub-sectors, where % denotes modulo, and the number of sub-sectors, are prime relative to each other, and in which
the number of data in the segment is smaller than the number of sectors in the frame, and the position of the code for correction is updated from segment to segment in associating the data position on the disc with the data position on the ECC block, as the interleaving rule is met. Data is recorded/reproduced by a disc format in which information word portion of the first error correction code in the ECC block is made up of interleaved second codes.

Preferably, wherein the data is recorded/reproduced by a disc format in which the direction of the second code is caused to coincide with the data direction on the disc.

Preferably, the data is recorded/reproduced by a disc format in which the code length of the second code is the information word length of the first error correction code.

Preferably, the direction of the second code is interleaved by a length equal to the segment length.

Preferably, the data is recorded/reproduced by a disc format in which the code length of the second code is such that > code length of second code=information word length of the first error correction code×segment length.

Preferably, the data is recorded/reproduced by a disc format having a sector ID such that length of sector ID×number of sectors=interleaving length×k, where k is a natural number, the sector ID length being such that length of sector ID=segment length×p, where p is the number of segments which is a natural number.

Preferably, the data is recorded/reproduced by a disc format in which the parity of the second code is arrayed in the sector ID.

Also preferably, the data is recorded/reproduced by a disc format in which the information word of the second code is made up only of user data or of the user data and the parity of the first error correction code, without changing block size of the ECC block.

According to the present invention, an optical disc recording/reproducing method, an optical disc and an optical disc device may be provided in which a logical format which has enabled long interleaving is constituted by a large block to enable data recording/reproduction to high reliability.

According to the present invention, an optical disc recording/reproducing method, an optical disc and an optical disc device may be provided in which data of sufficiently high reliability for ordinary use may be recorded/reproduced at a high transfer rate.

According to the present invention, an optical disc recording/reproducing method, an optical disc and an optical disc device may also be provided in which data may be recorded or reproduced at a high transfer rate.

According to the present invention, an optical disc recording/reproducing method, an optical disc and an optical disc device may also be provided in which data may be recorded or reproduced with plural logical formats of different block sizes with the same physical format.

BRIEF DESCRIPTION OF THE DRAWINGS

FIGS. 6A and 6B are schematic views showing the structure of an ECC block in an optical disc system shown in FIG. 5.

FIG. 7 is a schematic view showing a data structure in a sector in an optical disc system employing the ECC block.

FIG. 8 is a schematic view showing the relation between the data structure in the sector and the ECC (made up of the information word and the parity).

FIG. 9 is a schematic view showing the frame structure in the ECC block.

FIG. 12 is a schematic view showing the frame structure in the ECC block in case an ECC block is constituted by one sector.

FIGS. 13A and 13B are schematic views showing another frame structure in the ECC block.

FIG. 14 is a schematic view showing the data structure in a sector in case of the frame structure shown in FIG. 13.

FIG. 15 is a schematic view showing the relation between the data structure in a sector and the ECC (made up of the information word and the parity) in case of the frame structure shown in FIG. 13.

FIGS. 25A, 25B are schematic views showing the frame structure in the ECC block shown in FIG. 24.

FIG. 26 is a schematic view showing the data structure in a sector in an optical disc system employing the ECC block shown in FIG. 14.

DESCRIPTION OF THE PREFERRED EMBODIMENTS

Figure 1:
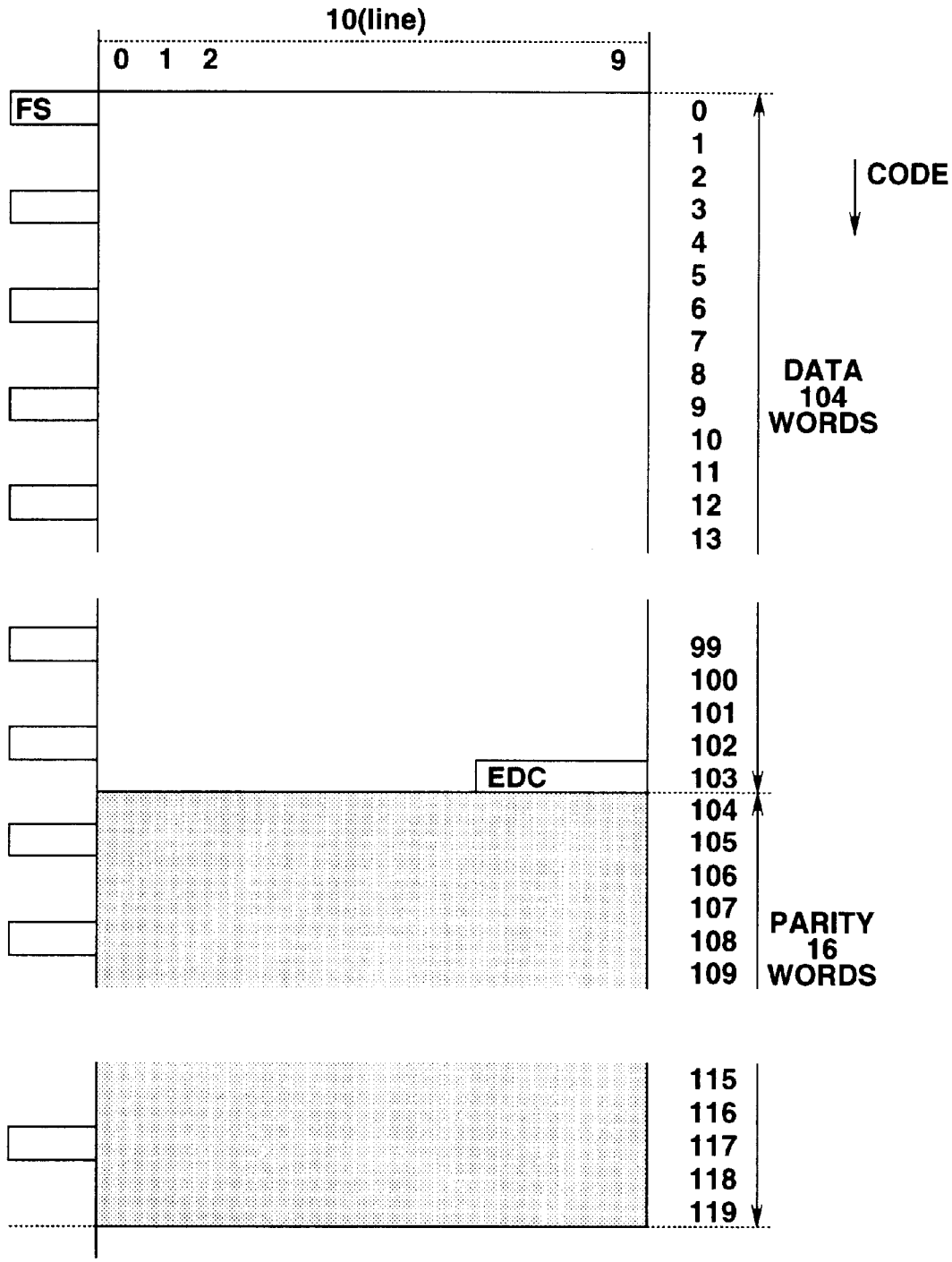
FIG. 1 schematically shows a frame structure in an ECC block in a format of a magneto-optical disc prescribed in ISO.
Figure 2A:
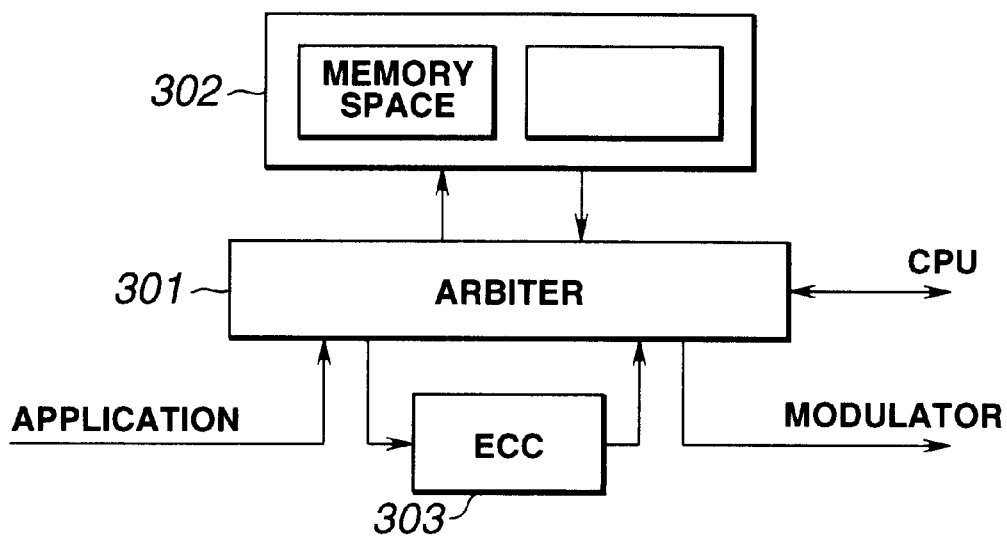
FIGS. 2A and 2B are schematic views showing the flow of data in the recording/reproducing operation for a magneto-optical disc prescribed in ISO.
Figure 2B:
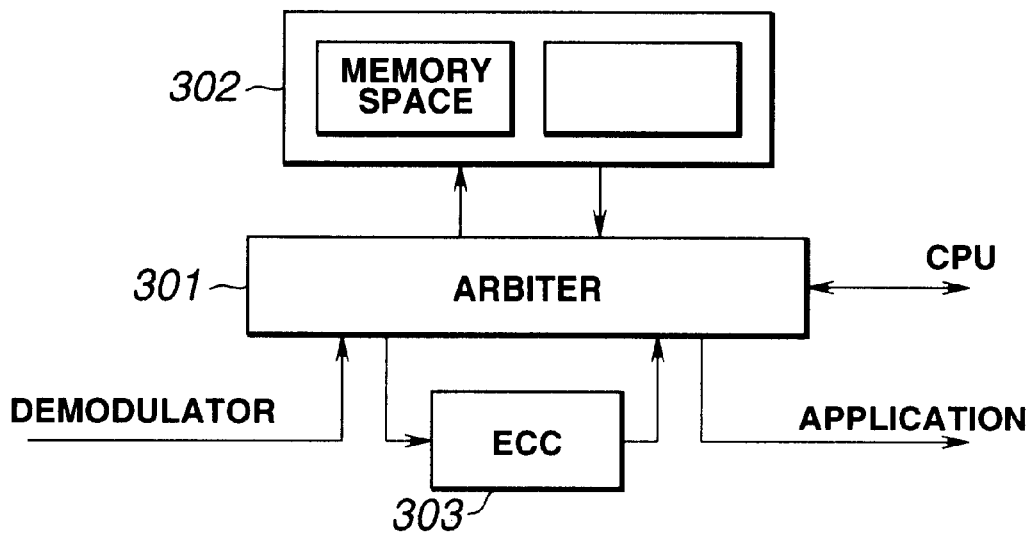

Referring to the drawings, preferred embodiments of the optical disc recording/reproducing method, optical disc and the optical disc device according to the present invention will be explained in detail.

An optical disc system embodying the present invention is explained first.

Figure 5:
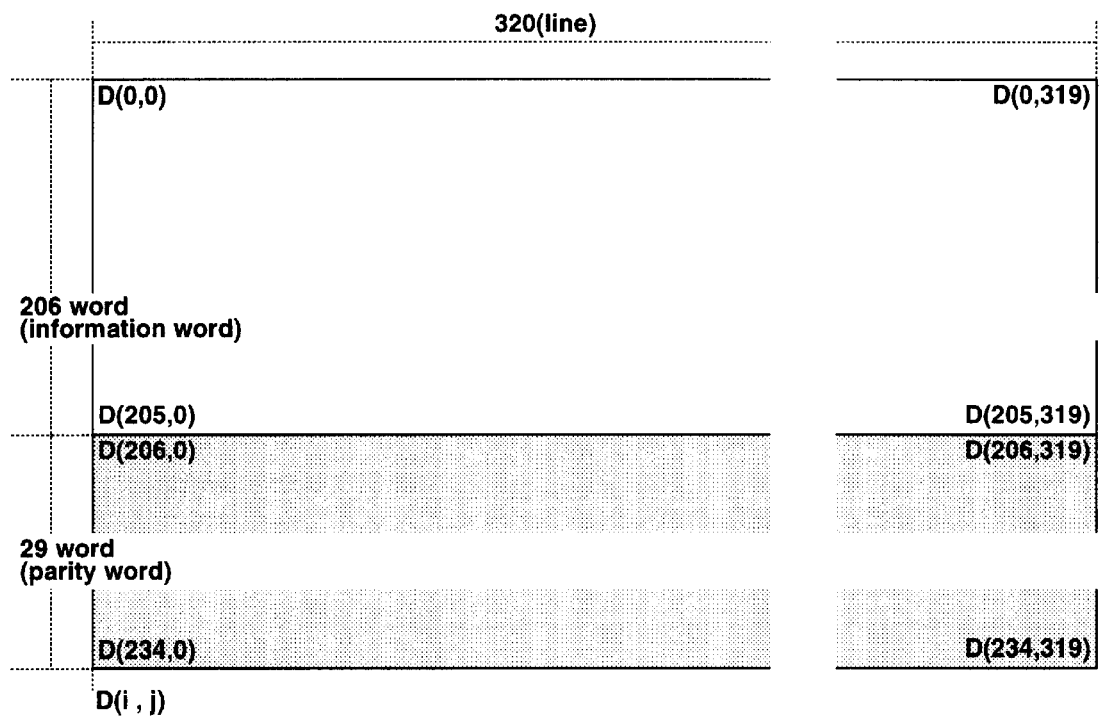
FIG. 5 is a schematic view showing the structure of an ECC block in an optical disc system embodying the present invention.

In the optical disc system, embodying the present invention, an ECC block of the block format as shown for example in FIG. 5 is used.

The ECC block, shown in FIG. 5, 320 lines each composed of 206 information words and the parity word code of 29 words are arrayed, with the code length being 235 (206 information words and 29 parity words) and with the interleaving length being 320. If it is assumed that the code is each g and each 235 word code is D(i,j) where i=0 to 234 and j=0 to 319, the code is generated so as to satisfy the following equation (1):

$$\sum_{i=0}^{234} Di \cdot x^{(234-i)} = p0(x) \cdot g0(x) \quad (1)$$

where g(x) is a generating polynominal and represented by $g(x)=(x-\alpha^{28}) \cdot (x-\alpha^{27}) \ldots (x-\alpha^2)$, with $\alpha$ being a root of a primitive polynominal $f(x)=x^8+x^4+x^3+x^2+x^0$ on $GF(2^8)$.

The number of data bytes in a frame of the ECC block is 100 bytes, as shown by the frame structure in FIG. 6A. By (1,7) modulation, for example, the 100 bytes per frame is turned into 1200 channels, as shown in FIG. 6B.

In the frame structure shown in FIGS. 6A and 6B, B(s, t, u, v) is modulated to m(s, t, u, w), where s, t, u, v and w stand for a sector, a frame, a segment, a data (byte) and an as-modulated channel. It is also possible to provide a DCC channel for appending the DCC code on the dc control (DCC) cell unit to control the dc component in the above (1, 7) modulation system.

Each segment is equivalent to 20 bytes equal to a sector ID length. Since each segment is of a length of 20 bytes corresponding to the length of the sector ID length, so that the number of segments in a frame is 5.

The number of sectors in this ECC block is 16, with the number of frames per sector being 47 and with the volume of user data per sector being equivalent to 4 KB.

Referring to FIG. 7, showing the structure of recording/reproducing data on a disc, a frame sync FS is attached to the leading end of a frame (frame(channel)) based channel string, APC and VFO are attached to the leading end of 47 frames (frame(channel)) and finally a post-amble PO is attached to complete a sector. It is noted that APC is a light-emitting pattern area for controlling the recording laser power during recording, while VFO is a pattern area for applying the PLL for clock extraction during reproduction. For the frame sync FS, there is used a unique pattern that is not used in the modulation rule of applying the channel synchronization. As for the frame sync FS, a frame sync FS0 indicating the leading end of a sector and other frame syncs FS1 are demarcated from each other. However, a sector sync SS may be inserted between the VFO and FS.

Figure 9:
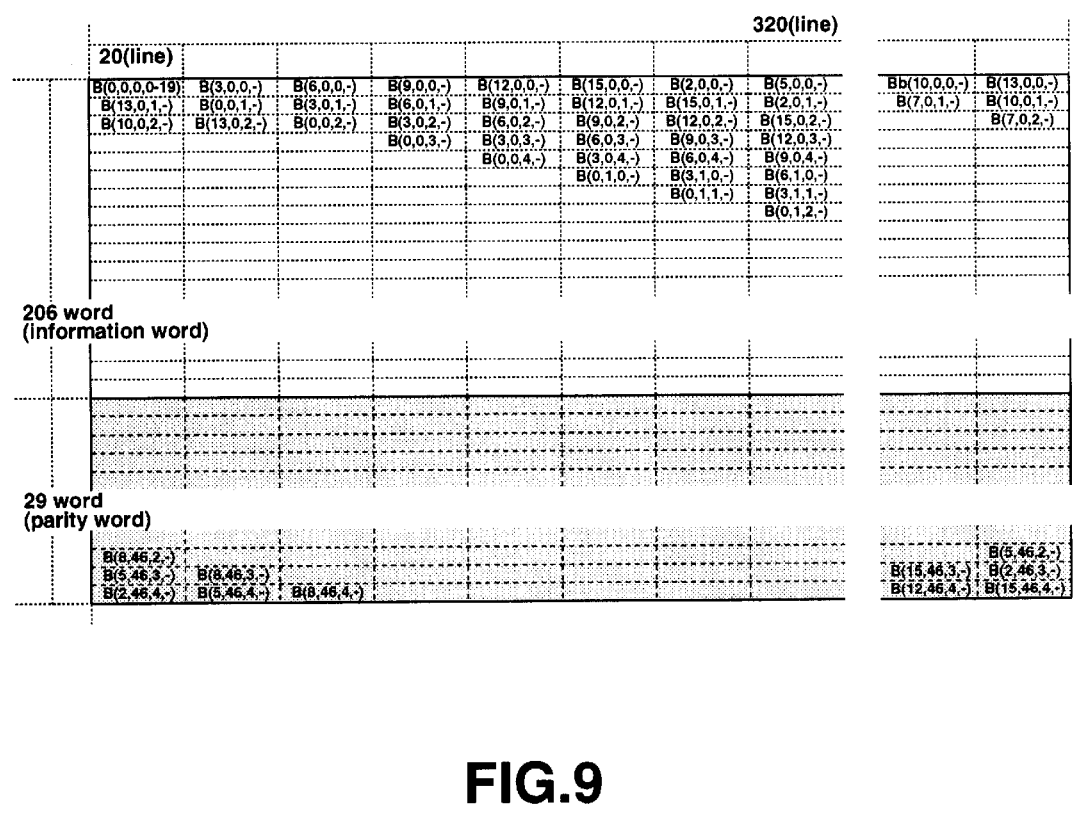

The relation between the data structure in the sector and the ECC (made up of the information words and parity) and the frame structure in the ECC block are shown in FIGS. 8 and 9, respectively.

There are $16=2^4$ sectors in this format, with k=1. Therefore, it is assumed that the code length is of an odd number, and the amount of data in the segment is smaller than the amount of data in the frame. In associating the data positions on the disc with the data position on the ECC block, the correction code position is updated from segment to segment, as the interleaving rule is met. This disc format renders it possible to associate the disc data on the daa on the ECC block in a one-for-one correspondence.

In the ECC block, shown in FIG. 5, the data direction of data on the disc is accorded by setting the arraying number from the upper order side to the lower order side in the rising sequence of B(s, t, u, v), that is in the sequence of s, t, u and v. The relation of D(i, j) and B(s, t, u, v), expressed in an equation, is given by $$B(s, t, u, v) = D(i, j)$$
$$= D([((((47Xs) + t)X20 + v)/20]\%235,$$
$$((((47Xs) + t)X5 + u)X20\%320$$

where [r] is a positive integer not exceeding r and % indicates modulo. The same applies for the following.

The leading segment of the leading frame of each sector is the sector ID.

In this format, the segment is equal to 20 bytes, the number of sectors is 16, the interleaving length is 320 and k=1. Therefore, segment length×number of sectors=interleaving length×k, (k=1).

That is, 20×16=320×1 and, by the above arraying, the sector ID corresponds to the first word in the information words of all correction codes, while user data corresponds to the second and the following words in the information words of all correction codes. Thus, the user data direction may be equated to the correction code direction without obstruction by the header.

Figure 10:
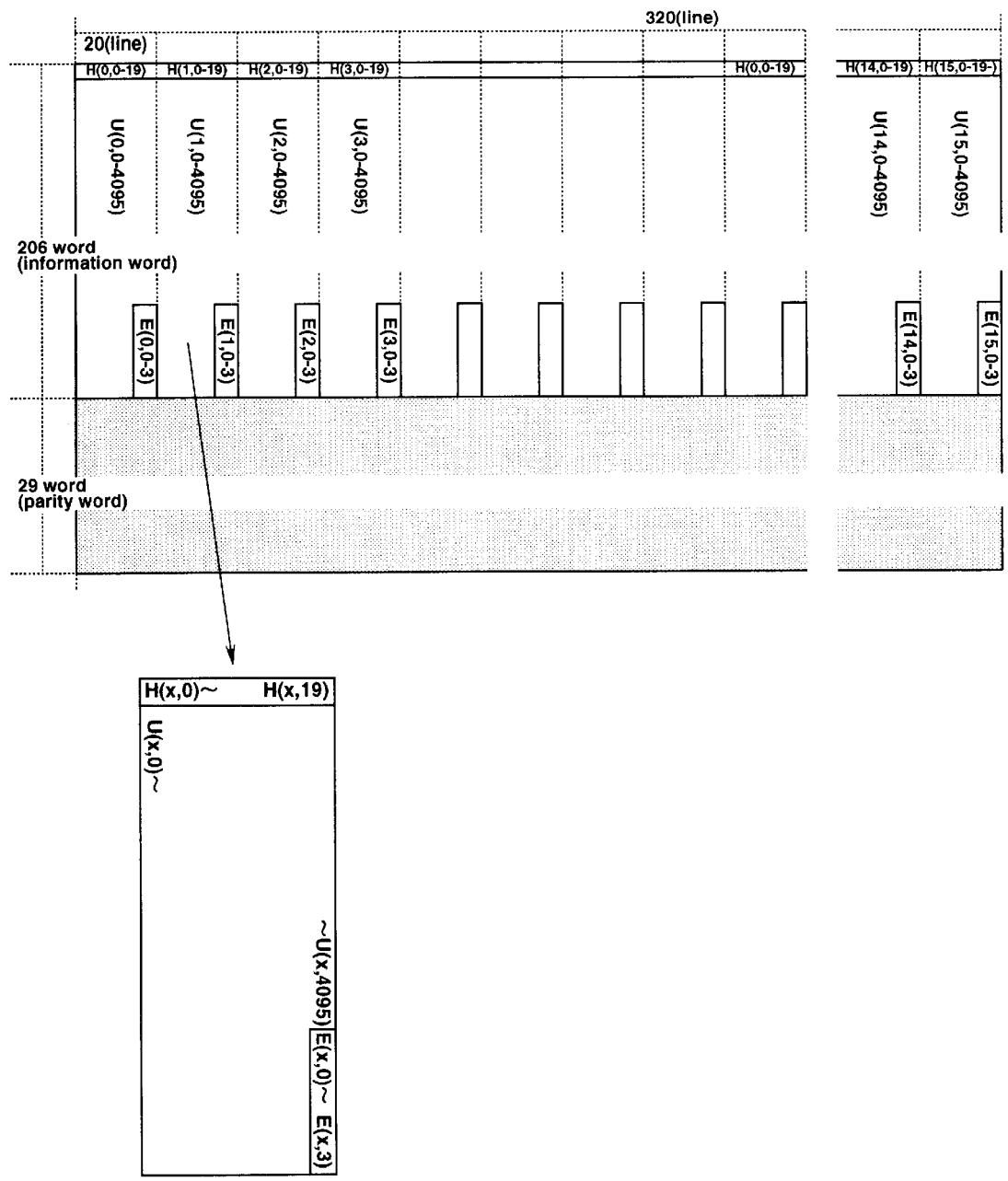
FIG. 10 is a schematic view showing an array and the structure of data units in the ECC block.
Figure 11:
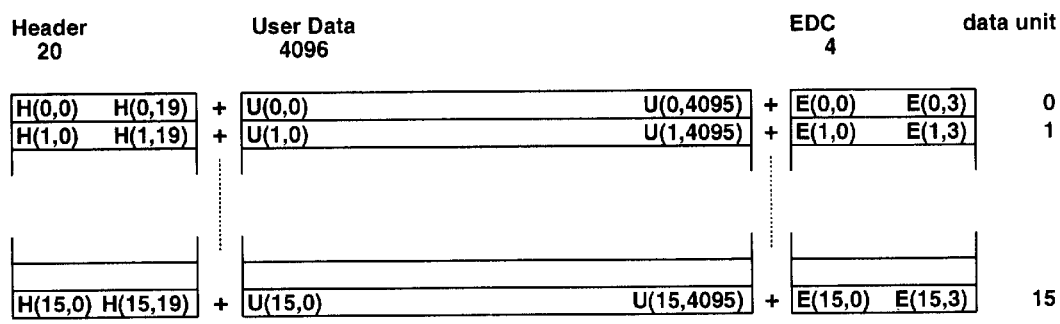
FIG. 11 is a schematic view showing the structure of user data in the optical system shown in FIG. 5.

The arraying of data units in the ECC block and the data unit structure are shown in FIGS. 10 and 11, respectively. H(g, h) is the header information, that is the sector ID information, U(g,h) is user data, and E(g,h) is the error correction code for user data, while g and h are the number of data units and the number of data, respectively.

The direction of ECC (error detecting direction) may be the same as the ECC code direction. However, error detection by the EDC is performed on the entire data of the data unit, that is user data and EDC.

The EDC is generated so as to satisfy the following equation (2):

$$\sum_{h=0}^{4096} Uh \cdot x^{4096-h} + \sum_{h=0}^{3} Eh \cdot x^{(4096-4096-h)} = p\varepsilon(x) \cdot g\varepsilon(x). \quad (2)$$

In this equation (2), g(x) is a generating polynominal, represented as $g(x)=(x-\alpha^3)\cdot(x-\alpha^2)\cdot(x-\alpha^1)\cdot(x-\alpha^0)$, where α is a root of the primitive polynominal $f(x^0=x^8+x^4+x^3+x^2+x^0$ on $GF(2^8)$.

The above header information H(g,h) contains the information used as ID in a CPU of a controller. A portion of the header information is occasionally used as a physical address information, such as a sector. The header information may also contain the information, such as the disc foreword, to which can be added the error detection code. There are occasions wherein an area for dummy data for substitution for the synchronization pattern is contained in the sector ID. This has no meaning for the application side, or the CPU of the controller.

The results detected by the error detection code E(g,h) and the user data U(g,h) are used, for example, by the CPU of the controller. It is however sufficient if only the user data U(g,h) is sent to the application side.

The array in which the direction of the user data U(g,h) is equated to the direction of the detection code E(g,h) may be expressed in terms of the relation of D(i,j) and E(g,h) by $$U(g, h) = D(i, j)$$
$$= D((hX205) + 1, 20Xg + [h/205]),$$
where h is 0 to 4095 and g is 0 to 15; and
$$E(g, h) = D(i, j)$$
$$= D(((4096 + h)\%205) + 1,$$
$$20Xg + [(4096 + h)/205]), \text{ where h is 0 to 3}$$
and g is 0 to 15.

Also, for the header information H(g,h),

H(g,h)=D(i,j)=D(0,20×g+h),where h is 0 to 19 and g is 0 to 15.

During reproduction, user data can immediately be sent to the application side if correction is made only for the required portion followed by EDC check. That is, it suffices if correction is made for the data unit, it being unnecessary to wait for the correction for one block.

It is also possible to make EDC check at the trailing end of the data unit, as the user data is sent to the application side, as soon as the correction of the necessary code comes to a close, without waiting for the end of the correction operation on the data unit or the end of the EDC check, and to send the results to the CPU.

During recording, the error correction code may be generated, as the user data is being sent from the application side. A parity word for a code can be generated at a time point when the information words for the code have been sent.

The error correction code EDC can also be generated at a time point when user data for one data unit have been sent.

Thus, the error correction code EDC can be generated by performing the EDC generating operation as the user data is being sent, by carrying out an arithmetic operation on the information words sent for the user data portion of the error correction code, and by carrying out an arithmetic operation on the generated parity for the parity word.

By using the above disc format, a number of the leading end data (B(x,x,00)) of the leading end of each frame, that is the leading segment, corresponding to the number of sectors, are distributed every segment length, so that the leading end data is distributed in 16 codes every 20 lines in the interleaving length. Thus, the data in specified positions in the frame may be prevented from being concentrated in specified codes to prevent the occurrence of correction impossibilities to assure invulnerability against errors that might produce bit slip.

If it is desired to reduce the number of sectors for diminish redundancy, such as pre-headers, the above-mentioned sectors may be collected together to provide an actual header.

If the use other than that for AV, such as a computer storage, is desired, there are occasions wherein a smaller file size is desirable. In a computer storage, it is frequently practiced to evade defective areas by substitution. Thus, there are occasions wherein a format which reduces the ECC block is used despite lowering in the error correction capability. Moreover, there is a merit that the discs of the two formats are similar, such that these can be handled on one common device. For example, although 16 sectors make up a sole ECC block in the above-described format, a disc of the same physical format may be used for recording/reproduction by using an ECC block in which the respective sectors are independent of one another.

FIG. 12 shows a frame structure in an ECC block for the case where an ECC block is constituted by a sector.

In the frame structure of FIG. 12, data of a sector make up an ECC block, and the user data of the ECC block constitutes one data unit. In this case, the data direction in a data unit may be the same as the ECC direction.

Figure 3:
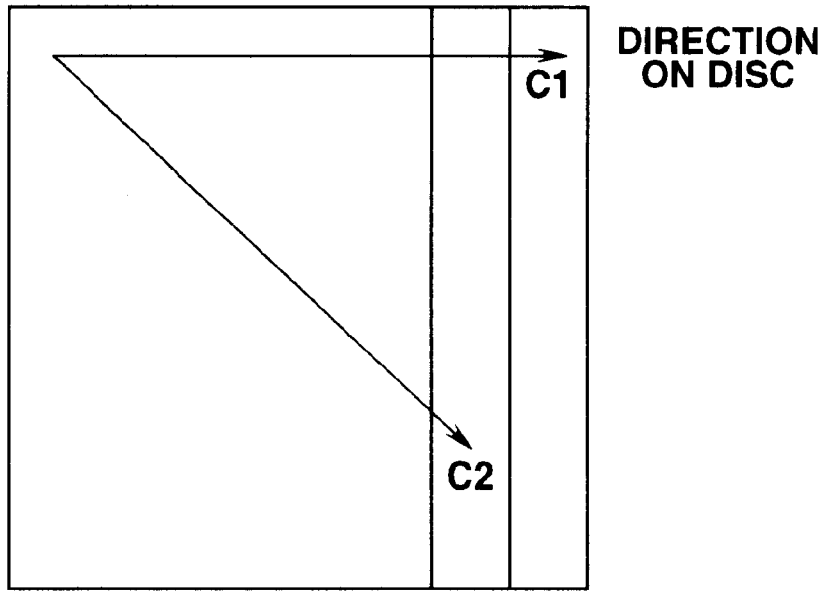
FIG. 3 shows a block structure of the product code known up to now.
Figure 4:
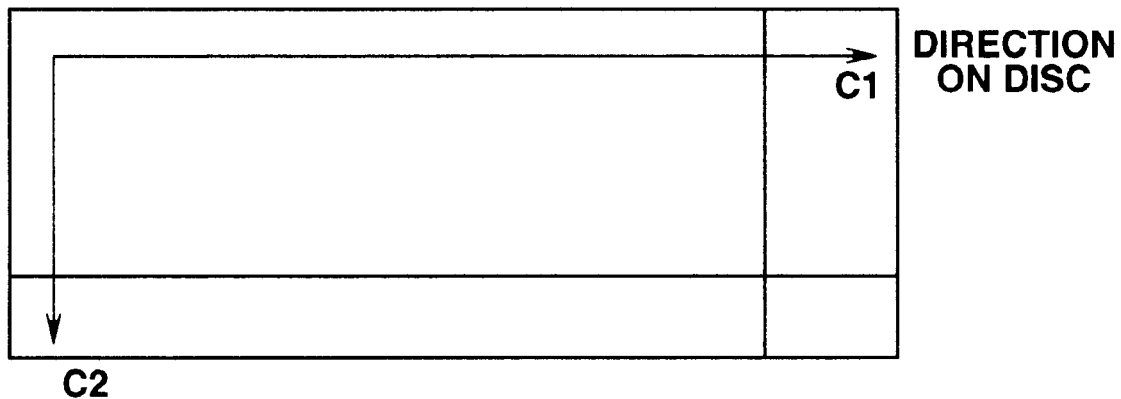
FIG. 4 shows an ECC block structure of a DVD.

FIGS. 13A and 13B show the frame structure in the ECC block for the case where the number of sectors is 32, with the ECC block structure being the same as that shown in FIG. 3.

In this frame structure, the number of data in a frame is 50 bytes, as shown in FIG. 13A, while the 50 bytes in a frame is turned into 600 channels by (1,7) modulation. That is, each segment is 10 bytes (120 channels), each frame being of 5 segments 50 bytes (600 channels). The address information is contained in a segment.

Figure 15:
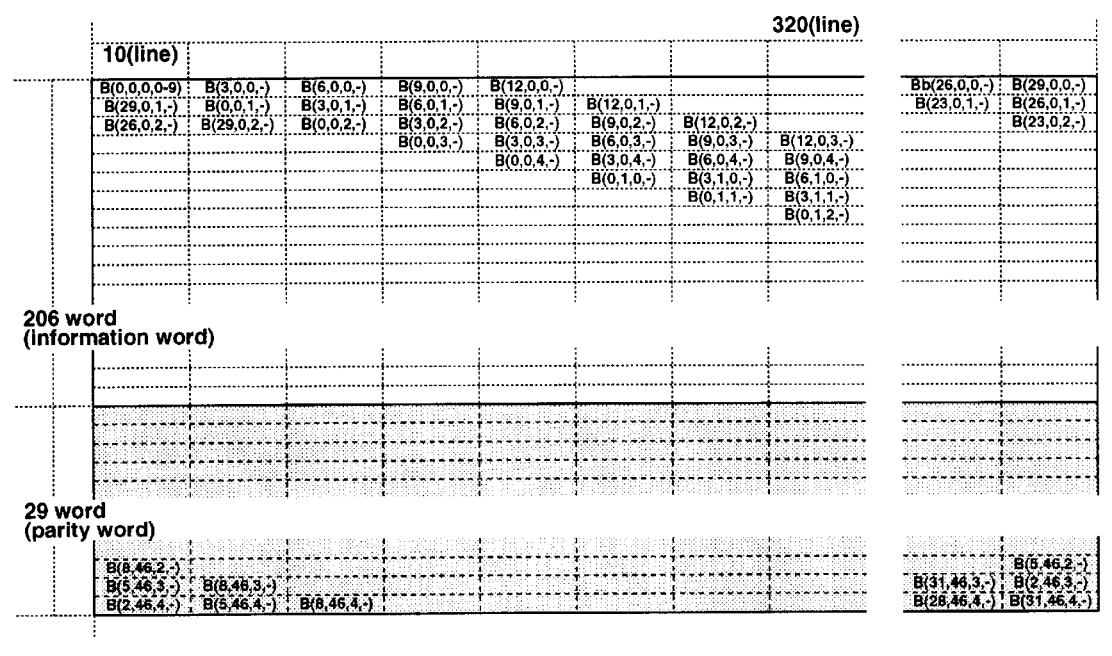

Referring to FIG. 14, showing the data structure in a sector, the number of sectors in an ECC block is 32. The frame structure in the ECC block is shown in FIG. 15.

Figure 16:
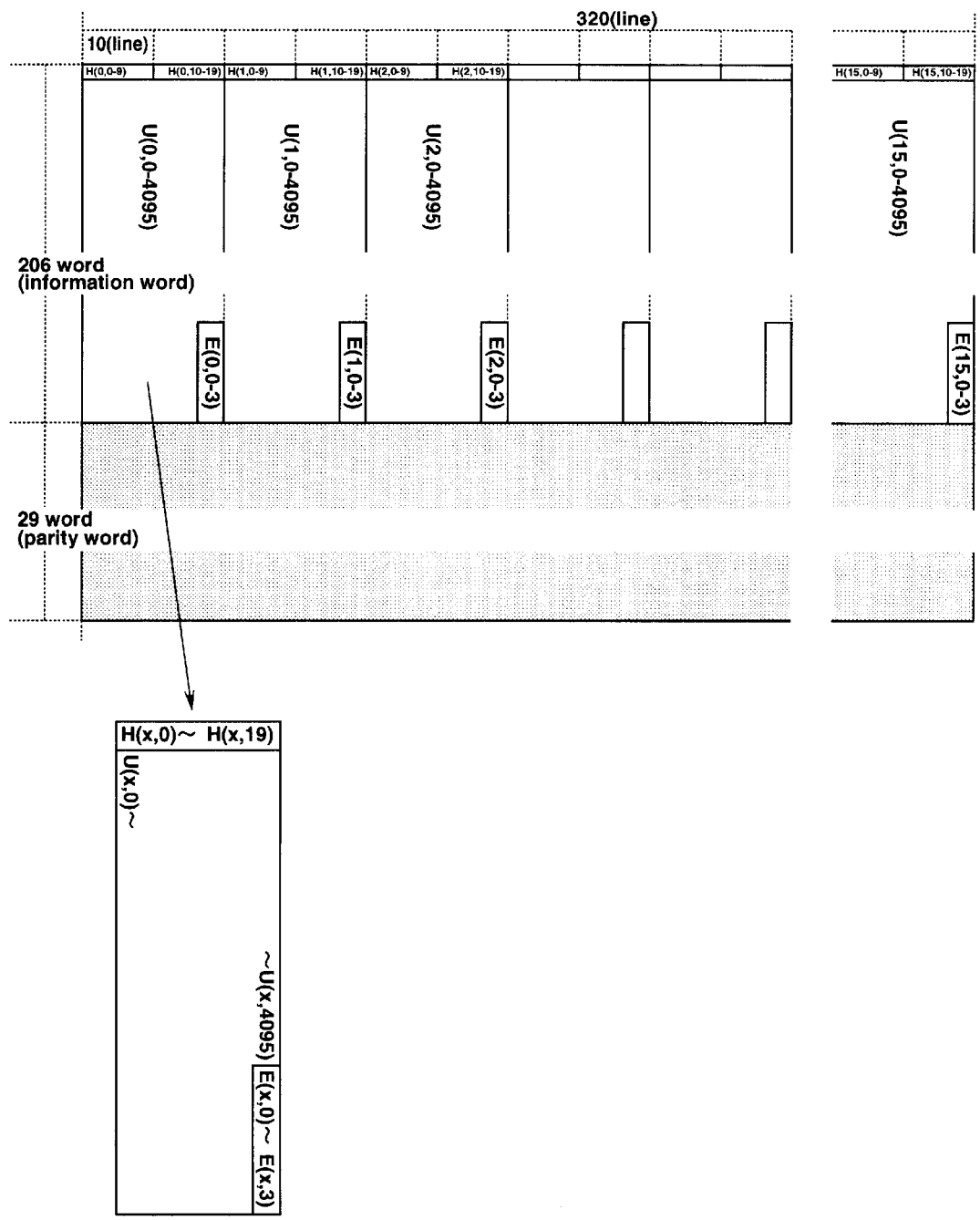
FIG. 16 is a schematic view showing an array and the structure of data units in the ECC block in case of the frame structure shown in FIG. 13.

Referring to FIG. 16, showing an array of data units in an ECC block, the number of data units in an ECC block is 16.

If desired to send the ID information of the data unit to the CPU, it suffices to set the address information of a sector 0 and that of a sector 1 are set to H(0, 0 to 9) and H(0, 10 to 19), respectively, or to obtain the information necessary for ID to produce the ID information for the data unit 0.

If the number of sectors in increased in this manner, it is possible to prevent data of specified positions in a frame from being concentrated in a specified code more pronouncedly than in the data format shown in FIGS. 5 to 11 to evade the occurrence of correction impossibility, and to assure invulnerability against errors which might lead to bit slip.

Figure 17:
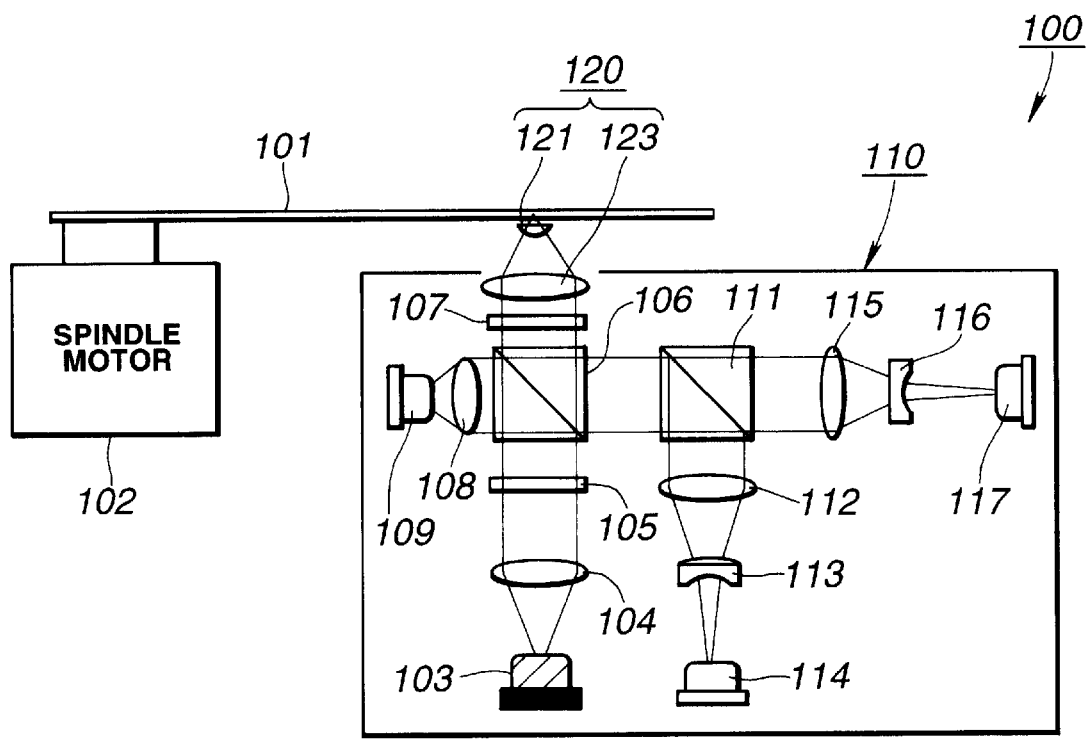
FIG. 17 is a block diagram showing the structure of a disc drive of an optical disc recording/reproducing apparatus for recording/reproducing user data for an optical disc of the format shown in FIG. 1.

The present optical disc recording/reproducing apparatus has a disc drive 100 of a structure shown in FIG. 17, and scans the information recording surface of an optical disc 101 by an optical head 110 with a laser light beam to optically record/reproduce the information as the disc is run in rotation by a spindle motor 102 at, for example, a constant angular velocity.

The optical head 110, provided in the disc drive 100, includes a semiconductor laser (LD) 103 as a light source for radiating the recording/reproducing laser light to the optical disc 101. The radiated light beam from the semiconductor laser 103 is collimated by a collimator lens 104 to traverse a diffraction grating 105 used for generating a side spot. The light beam then falls on an aspherical double-lens unit 120 via a beam splitter 106 and a quarter wave plate 107 so as to be then converged on an information recording surface of the optical disc 101. A portion of the outgoing light from the semiconductor laser 103 is reflected by the beam splitter 106 and sent via a converging lens 108 to a light emission power monitoring detector 109 so as to be used for automatic power control (APC) for controlling the laser power on the information recording surface. The reflected light from the optical disc 101, that is playback signals, are reflected by the beam splitter 106 and thence fed via beam splitter 111, converging lens 112 and a cylindrical lens 113 to a servo signal detector 114 for electro-optical conversion. The remaining portion of the reflected light falls on an RF signal detector 117 via lenses 115, 116 for electro-optical conversion. This optical head 110 generates focussing error signals using an astigmatic method, while generating tracking error signals using a differential push-pull method. Although the servo error signals and the playback RF signals are detected by the two signal detectors 114, 117, a sole detector may be used for this purpose.

Figure 18:
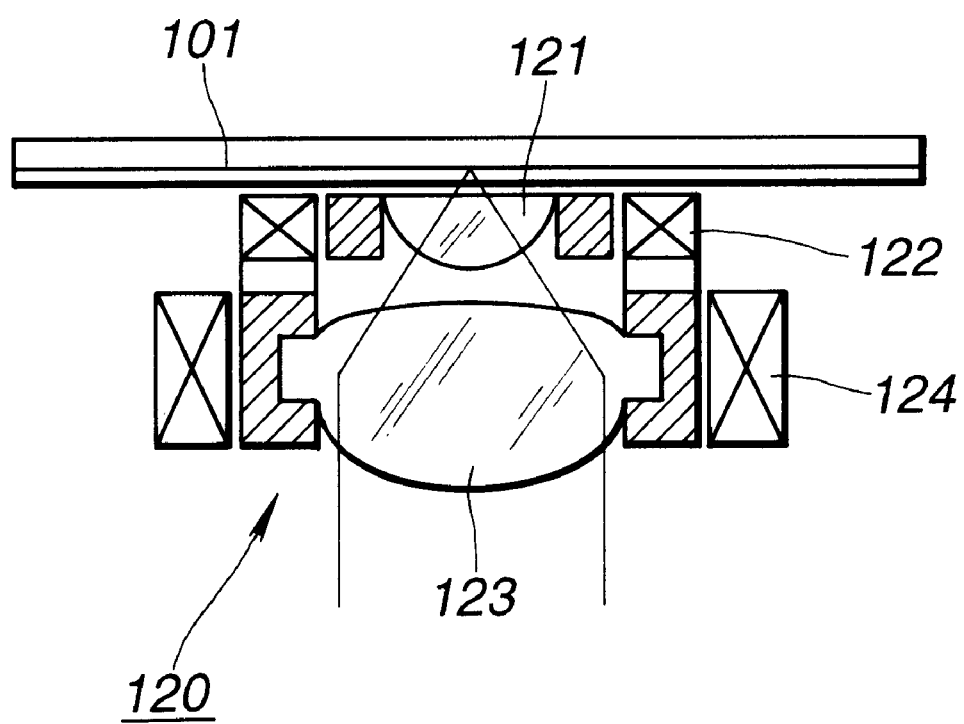
FIG. 18 is a schematic cross-sectional view showing the structure of an aspherical double-lens type objective lens unit provided on an optical head of the disc drive shown in FIG. 18.

The aspherical double-lens unit 120 includes a first electromagnetic actuator 122 for driving a first lens 121, and a second electromagnetic actuator 124 for driving a second lens 123, as shown in FIG. 18. The second lens 123 is loaded on the second electromagnetic actuator 124 movable along the optical axis direction and along the track direction, and has a numerical aperture approximately equal to 0.5. The first lens 121 is mounted on top of the second lens 123 on the first electromagnetic actuator 122 distinct from the second electromagnetic actuator 124 whereby it can be moved in a controlled manner to an optional position on the optical axis.

This optical disc recording/reproducing apparatus includes a recording/reproducing processing block 200, configured as shown in FIG. 17, connected to the disc drive 100 adapted for scanning the information recording surface of the optical disc 101 by the optical head 110 for recording/reproduction.

This recording/reproducing processing block 200 includes a computer (central processing unit (CPU) 202 for exchanging user data and control data with the application side via an application I/F circuit 201, and an arbitration processor 203. To the arbitration processor 203, there are connected not only a buffer memory 204 and an ECC processor 205 but also an in-sector timing generator 206 and a playback timing generator 207.

The recording/reproducing processing block 200 includes a modulator 208, fed with recording data from the arbitration processor 203 during recording, a pattern generator 211 and a selector 212, both actuated responsive to timing signals applied from the in-sector timing generator 206. The modulator 208 modulates recording data sent from the arbitration processor 203 in accordance with the RLL(1,7) modulation rule to send the modulation output to the selector 212. The pattern generator 211 generates APC, VFO and PO patterns. The selector 212 is responsive to timing signals sent from the in-sector timing generator 206 to select outputs of the modulator 208 or the pattern generator 211 to send recording channel signals which are sent to the disc drive 100.

The in-sector timing generator 206 RLL (2,7) demodulates playback signals of an address area (sector ID area) AR2 of the optical disc 101 (shown in FIG. 17) sent from the disc drive 100 to produce the address information which is sent as the sector position information to the CPU 202. Also, the in-sector timing generator 206 generates timing signals in the sector based on the sector position information in order to control the operation of the modulator 208, pattern generator 211 and the selector 212 during recording and in order to send reference timing signals to the playback timing generator 207 during reproduction. The CPU 202 performs accessing control for recording/reproducing user data based on the control data sent from the application side and the sector position information sent from the in-sector timing generator 206.

The recording/reproducing processing block 200 is further provided with a synchronization detector 213 and a demodulator 214 both of which are fed with playback channel signals from the disc drive 100 during reproduction. The synchronization detector 213 detects the synchronization signals contained in the playback channel signals to send the detected synchronization signals to the playback timing generator 207. The demodulator 214 processes the playback channel signals with RLL(1,7) demodulation associated with the RLL(1,7) modulation by the modulator 208 to generate playback data which is sent to the arbitration processor 203.

Figure 20A:
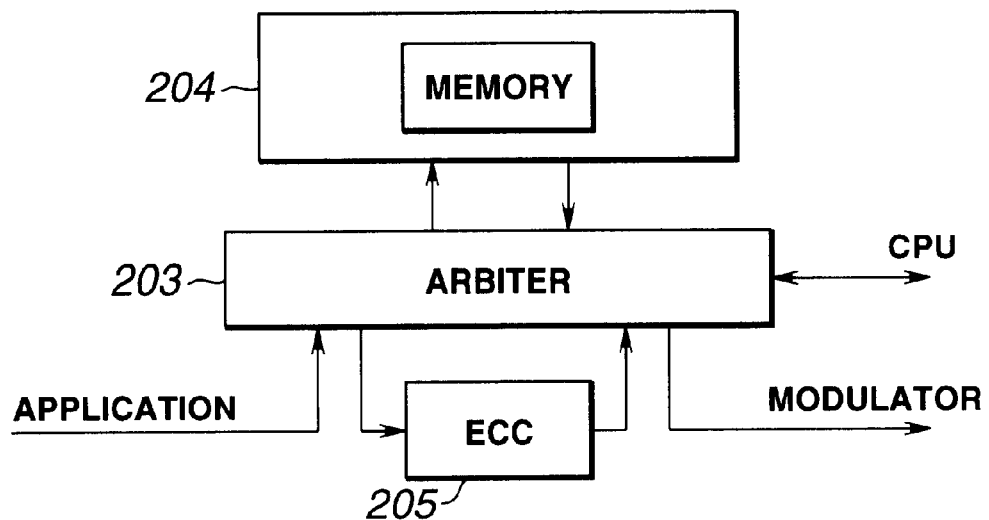
FIGS. 20A and 20B are schematic views the data flow in the recording/reproducing operation by the optical disc recording/reproducing apparatus shown in FIG. 17.

In the above-described recording/reproducing processing block 200, user data is sent from the application side to the ECC processor 205, while the ID information and reserve data are sent from the CPU 202, during recording, as shown in FIG. 20A. The ECC processor 205 generates the IDE and EDC which are further ECC encoded to provide data in the ECC block on the buffer memory 204.

The ECC processor 205 starts the encoding at a point in time when the data necessary to generate a code is sent thereto, without waiting until user data for a single ECC block is provided on the buffer memory 204.

At a time point when the encoding of the sole ECC block comes to a close, the data in the ECC block provided on the buffer memory 204 is RLL(1,7)-modulated by the modulator 208 at a timing of a sector for recording, indicated by the timing signals from the in-sector timing generator 206. The modulated data is turned by the selector 212 into recording channel signals, having appended thereto the APC, VFO, SS and PO patterns generated by the pattern generator 211. The recording channel signals, thus generated, are sent to the disc drive 100 for recording on a user area of the optical disc 101.

The arbitration processor 203 arbitrates address signals for the buffer memory, generated from the respective blocks, to re-array the data.

Figure 20B:
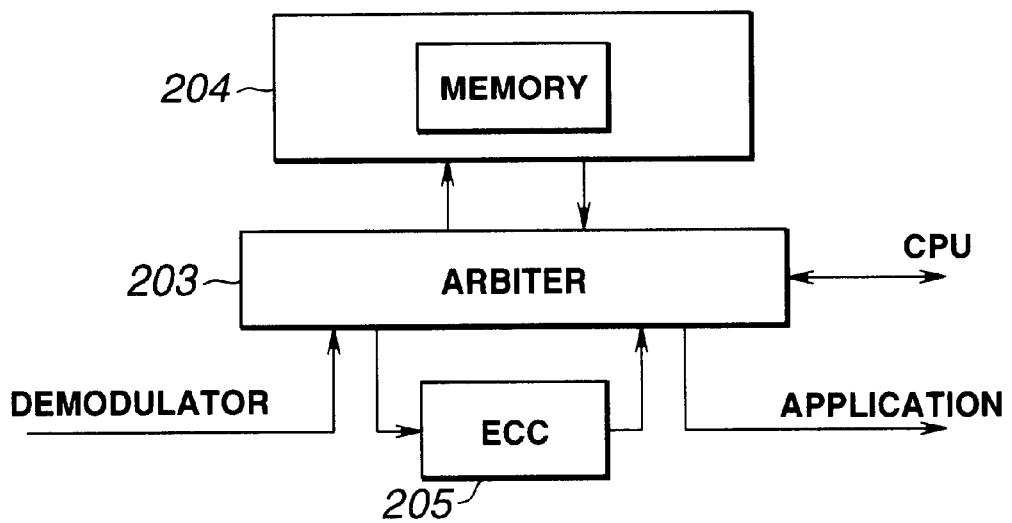

During reproduction, the arbitration processor 203 detects synchronization signals by the synchronization detector 213 from the reproduced playback channel signals to send the detected synchronization signals to the playback timing generator 207 by way of synchronization protection. Based on the timing of the playback timing generator 207, the arbitration processor 203 RLL(1,7) demodulates the playback channel signals by the demodulator 214 to send the playback data to the buffer memory 204, as shown in FIG. 20B. The ECC processor 205 ECC decodes the playback data to perform EDC check and also IDE check. As from the time point when data for a sole ECC block from the demodulator 214 has been sent, the ECC processor 205 corrects the playback data for errors, and sends out user data as from a time point the correction of a sole code has come to a close. That is, there is no necessity for waiting for correction for one ECC block.

In the above-described formats, the code position (word) is updated in terms of a segment, corresponding to the length of a header, that is a sector ID, as a unit. It is however sufficient if the number of data in the segment is selected to be smaller than the number of data in the frame, and if, in associating the data position on the disc with the data position on the ECC block, the correction code position is updated on the segment basis, such that the interleaving rule is met. That is, it suffices if the ECC block is constituted by one or more sectors, the sector is formed by plural frames, the block length of the ECC block is set so that block length=number of sectors×number of frames×frame length= code length×interleaving length while the number of sub-sectors is set so that number of sub-sectors–number of sectors×$p$ ($p$=number of segments: natural number)

and also if data is recorded/reproduced by a disc format in which the (code length×interleaving length)/(number of segments×number of sub-sectors)% number of sub-sectors (% meaning modulo) and the number of sub-sectors are prime relative to each other.

Figure 21:
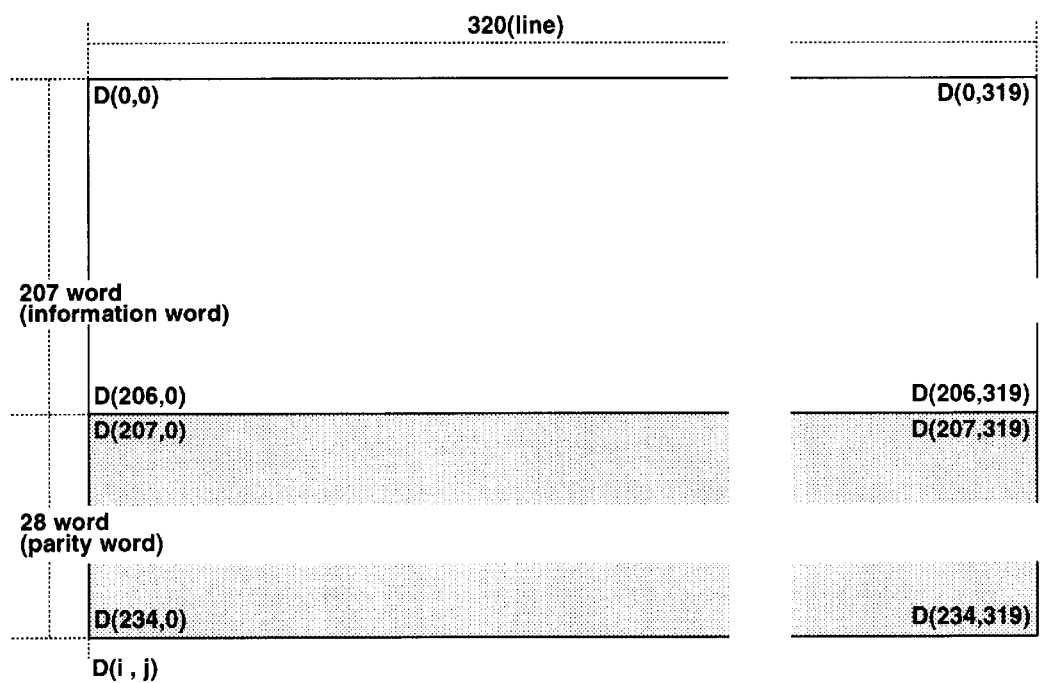
FIG. 21 is a schematic view showing another structure of an ECC block in the optical disc system embodying the present invention.

Similarly to the ECC block of FIG. 5, with the code length=235 (206 information words and 20 parity words) and with the interleaving length of 320, an ECC block with a code length of 235 (207 information words and 28 parity words) comprised of 320 lines of codes, each being made up of 207 information words and 28 parity words, with an interleaving length being 320, as shown in FIG. 21, is such a block data in which the ECC block has a frame structure shown in FIG. 6 to assume the data structure in a sector shown in FIG. 7.

That is, the ECC block shown in FIG. 5 is tantamount to a block in which the number of sectors is 16, the number of frames is 47, the frame length is 100 bytes, the code length is 235, interleaving length is 320, sector ID is 20, k is 1, segment length is 20, p is 1 and the number of sub-sectors is 16.

With the ECC block, shown in FIG. 21, the user data in the ECC block is 64 KB and the number of constituent sectors is 16.

Figure 22:
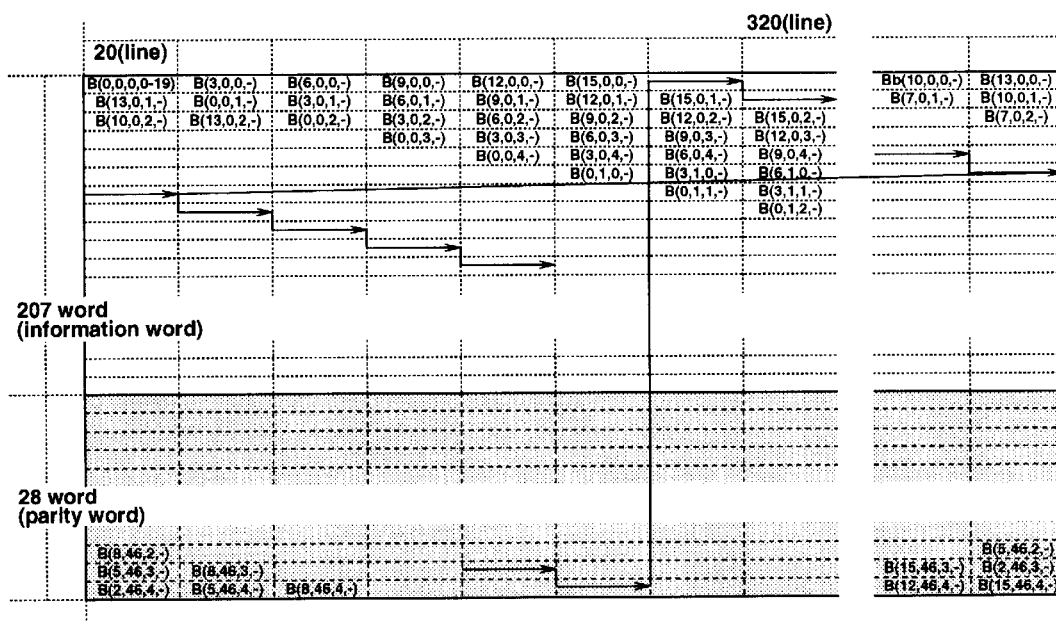
FIG. 22 is a schematic view showing a frame structure in the ECC block shown in FIG. 21.
Figure 23:
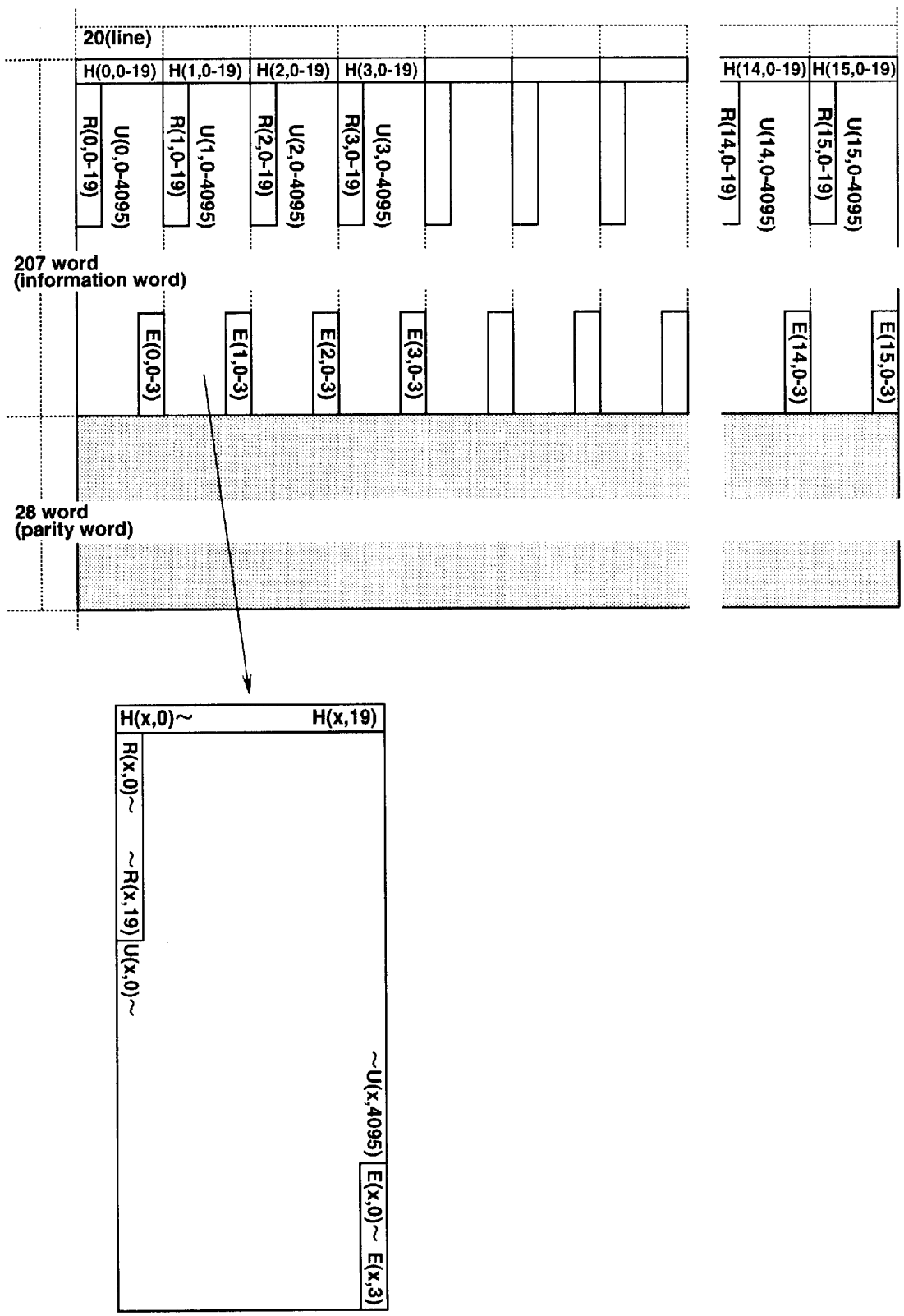
FIG. 23 is a schematic view showing an array and the structure of a data unit in the ECC block shown in FIG. 21.

The frame structure in the ECC block in this case is shown in FIG. 22, while the array and the structure of the data units are shown in FIG. 23. H(g,h) is the header information, that is sector ID information, R(g,h) is the 20-byte information at the leading end of each sector, U(g,h) is user data, and E(g,h) is the error detection code EDC for user data, with g and h being the number of data units and the number of data, respectively.

Figure 19:
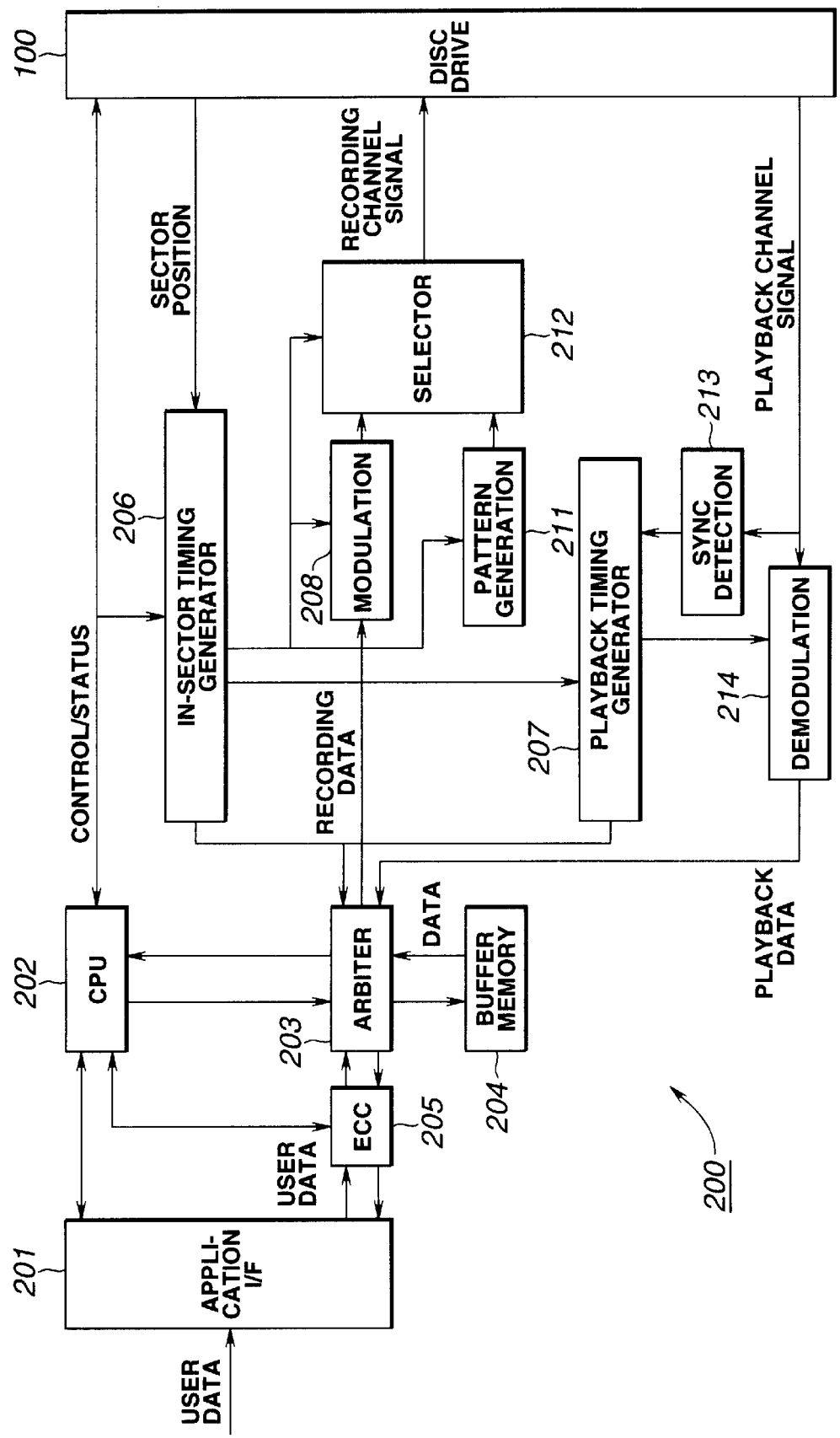
FIG. 19 is a block diagram showing a recording/reproducing processing block in the optical disc recording/reproducing apparatus shown in FIG. 17.

In the ECC block, shown in FIG. 19, the data direction of data on the disc is accorded by setting the arraying number from the upper order side to the lower order side in the rising sequence of B(s, t, u, v), that is in the sequence of s, t, u and v. The relation of D(i, j) and B(s, t, u, v), expressed in an equation, is given by $$B(s, t, u, v) = D(i, j)$$
$$= D([((((47Xs) + t)X5 + u)X20 + v)/20]\%235,$$
$$((((47Xs) + t)X5 + u)X20 + v)\%320.$$

Also, if an array in which the direction of the user data U(g,h) is equated to the direction of the error correction code E(g,h) is expressed by the relation of D(i,j), R(g,h), U(g,h) and E(g,h), we obtain $$R(g, h) = D(i, j)$$
$$= D((h\%206) + 1, 20Xg + [h/205])$$
$$= D(h + 1, 20Xg)$$

where h is 0 to 19 and g is 0 to 15

$$U(g, h) = D(i, j)$$
$$= D(((20 + h)\%206) + 1, 20Xg + [(20 + h)/206])$$

where h is 0 to 4095 and g is 0 to 15

$$E(g, h) = D(i, j)$$
$$= D(((4116 + h)\%206) + 1, 20Xg + [(4116 + h)/h206])$$

where h is 0 to 3 and g is 0 to 15.
As for the header information H(g,h), $$H(g, h) = D(i, j)$$
$$= D(0, 20Xg + h)$$

where h is 0 to 19 and g is 0 to 15.

Thus, in the ECC block, shown in FIG. 21, specified data in a frame, for example, leading end data of a frame R(g,h), are distributed in sixteen positions every 20 codes. The sector ID is at the leading end 20 bytes of each sector.

Also, the ECC block shown in FIG. 12, constituting a sole ECC block by one sector, is tantamount to a block in which the number of sectors is 1, the number of frames is 47, the frame length is 100 bytes, the code length is 235, interleaving length is 20, sector ID is 20, k is 1, segment length is 20, p is 1 and the number of sub-sectors is 1.

In this ECC block, the user data in the ECC block is 4 KB and the number of constituent sectors is 1. The leading end data of a frame R(g,h), are distributed in one position every 20 codes. The sector ID is at the leading end 20 bytes of each sector.

Also, the ECC block shown in FIGS. 13 to 16, constituting a sole ECC block by one sector, is tantamount to a block in which the number of sectors is 32, the number of frames is 47, the frame length is 50 bytes, the code length is 235, interleaving length is 320, sector ID is 10, k is 1, segment length is 10, p is 1 and the number of sub-sectors is 32.

In this ECC block, the user data in the ECC block is 64 KB and the number of constituent sectors is 32. The leading end data of a frame R(g,h), are distributed in 32 positions every 10 codes. The sector ID is at the leading end 10 bytes of each sector.

It is noted that, in the ECC block, shown in FIG. 21, similarly to the ECC block shown in FIG. 5, the user data in the ECC block is 64 KB, the number of constituent sectors is 16 so that the sector Ids are concentrated. However, in an ECC block in which, for example, the number of sectors is 16, the number of frames is 100, the frame length is 47 bytes, the code length is 235, interleaving length is 320, sector ID is 20, k is 1, segment length is 5, p is 4 and the number of sub-sectors is 64, the frame leading end data R(g,h) are distributed at 64 places every five codes, with the number of user data in the ECC block equal to 64 KB and with the number of constituent sectors being 16. Thus, the sector IDs are distributed at four places every 5 bytes.

Also, in an ECC block in which, for example, the number of sectors is 16, the number of frames is 50, the frame length is 94 bytes, the code length is 235, interleaving length is 320, sector ID is 20, k is 1, segment length is 10, p is 2 and the number of sub-sectors is 32, the frame leading end data R(g,h) are distributed at 32 places every 10 codes, with the number of user data in the ECC block equal to 64 KB and with the number of constituent sectors being 16. Thus, the sector IDs are distributed at two places every ten bytes.

By distributing specified words, that is sector Ids in a frame, invulnerability to errors can be realized.

Moreover, in reducing the number of data in the segment so as to be smaller than the number of data in a frame for associating the data positions on the disc with that on the ECC block, it is possible to distribute the specified words in the frame over a wide range by updating the correction code position on the byte basis under the condition that the interleaving rule is met.

Figure 24:
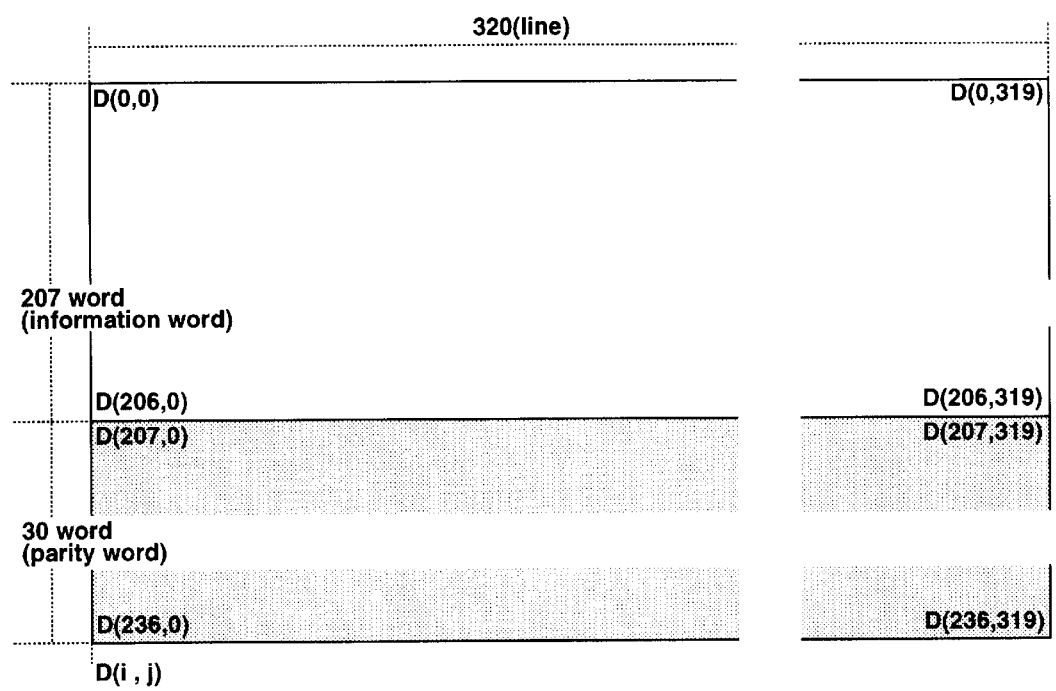
FIG. 24 is a schematic view showing another structure of an ECC block in the optical disc system embodying the present invention.

For example, in an ECC block with a code length of 237, made up of 207 information words and 30 parity words, with the interleaving length being 320, obtained by arraying 320 lines each being made up of 207 information words and 30 parity words to form a blocked data, as shown in FIG. 24, 79 bytes of one frame data of the ECC block, the frame structure of which is shown in FIG. 25A, are converted by (1,7) modulation into 948 channels, as shown in FIG. 25B.

In the frame structure shown in FIGS. 25A and 25B, B(s, t, u, v) is modulated to m(s, t, u, w), where s, t, u, v are a sector, a frame, a segment and data, respectively, while w denotes the as-modulated channel. It is also possible to provide a DCC channel in which a DCC code is attached on the dc control cell basis n order to control the dc components n the (1,7) modulation system.

Referring to FIG. 26, showing the structure of recording/reproducing data on a disc, a frame sync FS is attached to the leading end of a frame channel based channel string, and APC and VFO are attached to the leading end of the 47 frame (frame(channel)). Finally, a post-amble PO is attached to constitute a sector. The APC is a light emitting pattern area for controlling the recording laser power during recording, while the VFO is a pattern area for applying the PLL for clock extraction during reproduction. For the frame sync FS, there is used a unique pattern not used in the modulation rule used in turn for applying channel synchronization. In this format, the frame sync FS0 indicating the leading end of a sector is distinguished from other frame syncs FS1 in the frame sync FS. Alternatively, a sector sync SS may be inserted between the VFO and the FS.

In the present ECC block, the number of sectors, the number of frames, the frame length, the code length, interleaving length, sector ID, k, segment length, p and the number of sub-sectors are set to 16, 60, 79, 237, 320, 20, 1, 1, 20 and 320. Thus, in associating the data positions on the disc with the data position on the ECC block, the correction code position is updated from segment to segment, as the interleaving rule is met. This disc format renders it possible to associate the disc data on the data on the ECC block in a one-for-one correspondence.

Figure 27:
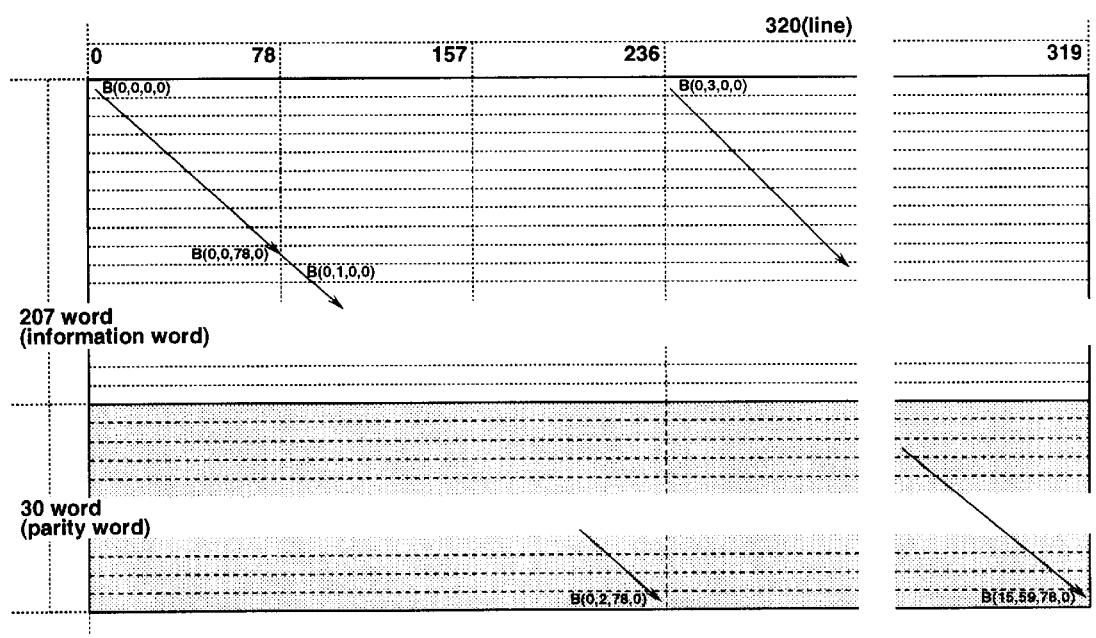
FIG. 27 is a schematic view showing the frame structure in the ECC block shown in FIG. 24.

The frame structure in the ECC block is shown in FIG. 27.

In the ECC block, shown in FIG. 24, the data direction of data on the disc is accorded by setting the arraying number from the upper order side to the lower order side in the rising sequence of B(s, t, u, v), that is in the sequence of s, t, u and v. The relation of D(i, j) and B(s, t, u, v), expressed in an equation, is given by $$B(s, t, u, v) = D(i, j)$$
$$= D([((((60Xs) + t)X79 + u)X1 + v)/1]\%237,$$
$$((((60Xs) + t) + t)X79 + u)X1 + v)\%320.$$

By the above arraying, one-block data on the disc can be associated with the totality of data on the ECC block in a one-for-one correspondence. In this case, the header, that is the sector ID, corresponds to the first word in the information words of all correction codes, while user data corresponds to the second and the following words in the information words of all correction codes. Thus, the user data direction may be equated to the correction code direction without obstruction by the header.

Figure 28:
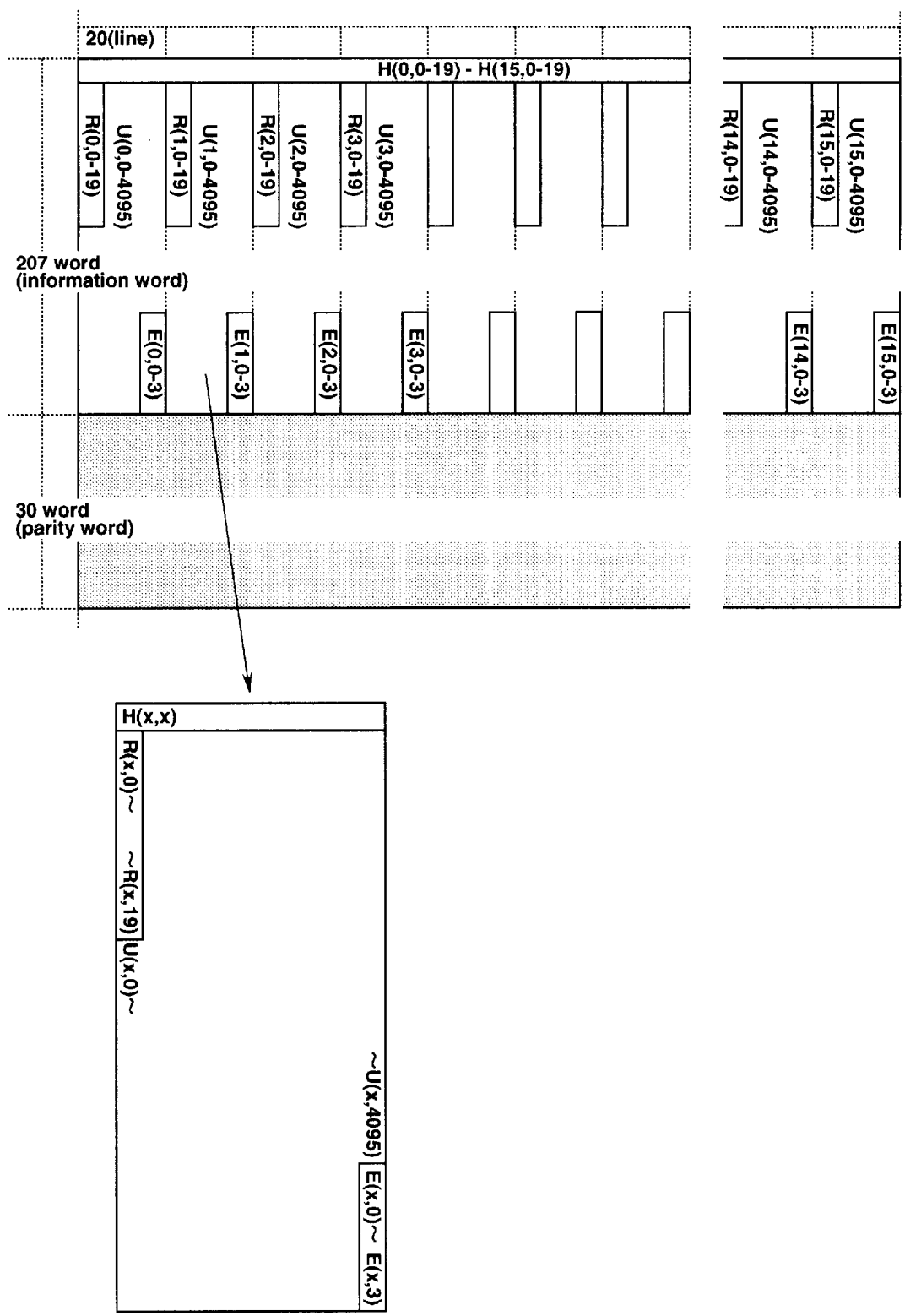
FIG. 28 is a schematic view showing an array and the structure of a data unit in the ECC block shown in FIG. 24.

The arraying of data units in the ECC block and the data unit structure are shown in FIG. 28. H(g, h) is the header information, that is the sector ID information, R(g,h) is the leading 20 byte information of each sector, U(g,h) is user data, and E(g,h) is the error correction code for user data, while g and h are the number of data units and the number of data, respectively.

In the ECC block, shown in FIG. 19, the data direction of data on the disc is accorded by setting the arraying number from the upper order side to the lower order side in the rising sequence of B(s, t, u, v), that is in the sequence of s, t, u and v. The relation of D(i, j) and B(s, t, u, v), expressed in an equation, is given by $$B(s, t, u, v) = D(i, j)$$
$$= D([((((47Xs) + t)X5 + u)X20 + v)/20]\%235,$$
$$((((47Xs) + t)X5 + u)X20 + v)\% 320.$$

Also, if an array in which the direction of the user data U(g,h) is equated to the direction of the error correction code E(g,h) is expressed by the relation of D(i,j), R(g,h), U(g,h) and E(g,h), we obtain $$R(g, h) = D(i, j)$$
$$= D((h\%206) + 1, 20Xg + [h/205])$$
$$= D(h + 1, 20Xg)$$

where h is 0 to 19 and g is 0 to 15

$$U(g, h) = D(i, j)$$
$$= D(((20 + h)\%206) + 1, 20Xg + [(20 + h)/206])$$

where h is 0 to 4095 and g is 0 to 15

$$E(g, h) = D(i, j)$$
$$= D(((4116 + h)\%206) + 1, 20Xg + [(4116 + h)/206])$$

where h is 0 to 3 and g is 0 to 15.

As for the header information H(g,h), $$H(g, h) = D(i, j)$$
$$= D(0, (((20Xg + h)/1)X237 + ((20Xg + h)\%1))\%320)$$
$$= D(0, (20Xg + h)/1)X237\%320$$

where h is 0 to 19 and g is 0 to 15.

In the ECC block, shown in FIG. 24, the number of user data in the ECC block is 64 KB, and the number of constituting sectors is 16, such that the frame leading data R(g,h) is distributed uniformly at 320 places in each code. The sector IDs are distributed on the byte basis.

In the ECC block, shown in FIG. 24, the number of sub-sectors is 320, and the frame leading data R(g,h) is adapted to be distributed evenly at 320 places in each code. In an ECC block having the number of sub-sectors equal to 160, with the number of sectors, number of frames, frame length, code length, interleaving length, sector ID, k, segment length, p and the number of sub-sectors equal to 16, 60, 158 bytes, 237, 320, 20, 1, 1 and 20 and 160, respectively, the number of user data in the ECC block is 64 KB, the number of constituent sectors is 16 and the frame leading end data R(g,h) is distributed in 160 places every two codes. The sector IDs are distributed on the byte basis.

Although the number of sectors in the ECC block shown in FIG. 24 is 16, the number of sectors can be modified optionally.

In an ECC block, in which the number of sectors, number of frames, frame length, code length, interleaving length, sector ID, k, segment length, p and the number of sectors equal to 32, 30, 79 bytes, 237, 320, 120, 1, 1 and 320, respectively, the number of user data in the ECC block is 64 KB, the number of constituent sectors is 32 and the frame leading end data R(g,h) is distributed in 320 places in every code. The sector IDs are distributed on the byte basis.

In an ECC block, in which the number of sectors, number of frames, frame length, code length, interleaving length, sector ID, k, segment length, p and the number of sectors equal to 64, 15, 79 bytes, 237, 320, 5, 1, 5 and 320, respectively, the number of user data in the ECC block is 64 KB, the number of constituent sectors is 64 and the frame leading end data R(g,h) is distributed in 320 places in every code. The sector IDs are distributed on the byte basis.

In the ECC block, shown in FIG. 24, the number of user data in the ECC block is 32 KB. For example, in an ECC block, in which the number of sectors, number of frames, frame length, code length, interleaving length, sector ID, k, segment length, p and the number of sectors equal to 16, 30, 79 bytes, 237, 160, 10, 1, 10 and 160, respectively, the number of user data in the ECC block is 32 KB, the number of constituent sectors is 16 and the frame leading end data R(g,h) is distributed in 160 places in every code. The sector IDs are distributed on the byte basis.

Figure 29:
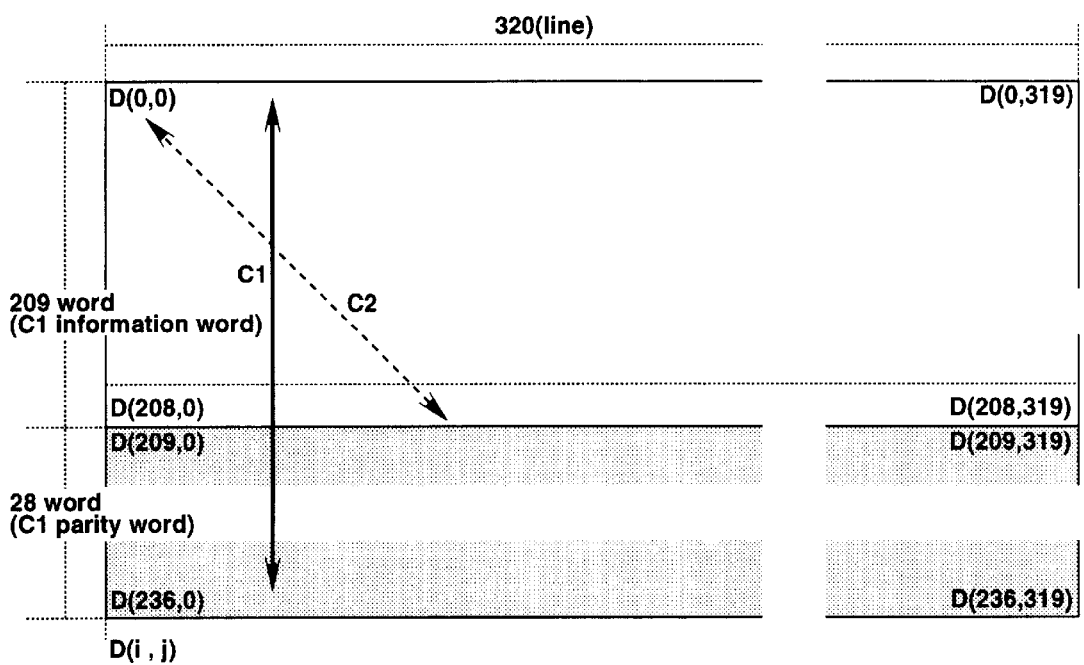
FIG. 29 shows an illustrative structure of an ECC block embodying the present invention.

The structure of an ECC block, in which the present invention is applied to an ECC block shown in FIG. 5 or to an ECC block shown in FIG. 21, is shown in FIG. 29.

Figure 30:
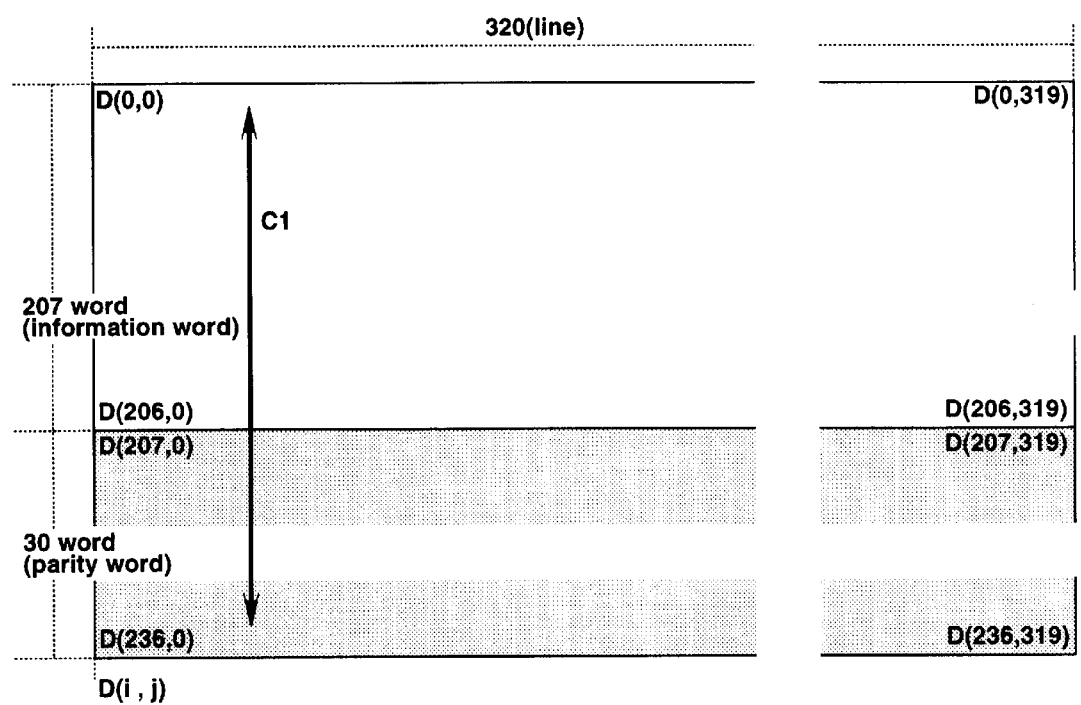
FIG. 30 shows an ECC block of the block format which is to be the basis of the ECC block shown in FIG. 29.
Figure 31:
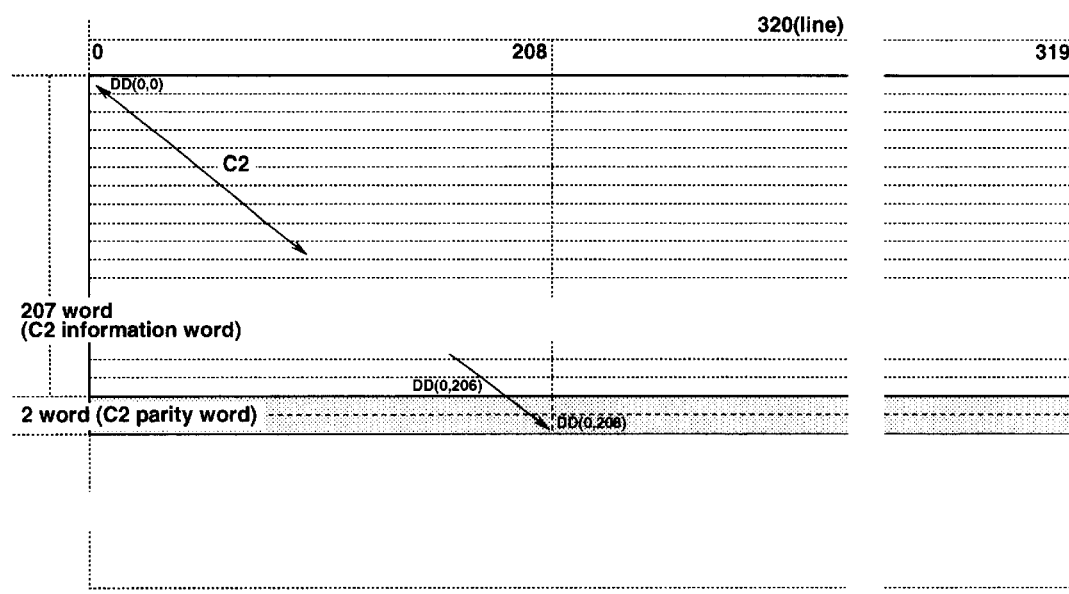
FIG. 31 illustrates the structure of the second C2 code of the ECC block shown in FIG. 29.

The ECC block, shown in FIG. 29, roughly corresponds to an ECC block of the block format shown in FIG. 30, that is an ECC block with a code length of 237, made up of 207 information words and 30 parity words, with the interleaving length being 320, obtained by arraying 320 lines each being made up of 207 information words, and a code C1 of 30 parity words to form a blocked data, with the first error correction code C1 being now replaced by a second code C2 different in data direction from the first error correction code C1, as shown in FIG. 31, to provide a product code configuration.

In the ECC block, shown in FIG. 5, D(i,j)/i is 0 to 236, with j being 0 to 319. In each j of the ECC block, an RS (237, 209, 29) code (=C1), is constituted, with the total number of codes being 320.

In the ECC block, shown in FIG. 30, D(i,j)/i is 0 to 236, with j being 0 to 236. In each j of the ECC block, an RS (237, 209, 31) code (=C1), is constituted, with the total number of codes being 320. In this error correction code C1, the parity is generated with the sector ID information, user data and the error correction code EDC for the user data as the information words.

In the configuration of the second code C2, shown in FIG. 31, DD(ii, jj)/ii is 0 to 236, with jj being 0 to 236. In each jj of the ECC block, an RS (237, 209, 31) code (=C1), is constituted by the codes, with the total number of codes being 320. The direction of the second code C2 is the same as the data direction on the disc. DD(ii, jj) is the same as the data direction on the disc.

The second code C2 generates the parity with the sector ID information, user data and the error detection code (EDC) for the user data as the information words.

The first error correction code C1 generates the parity with the generated second code C2 as the information words. Here, the code length of the second code C2 is the information word length of the first error correction code C1.

Figure 32:
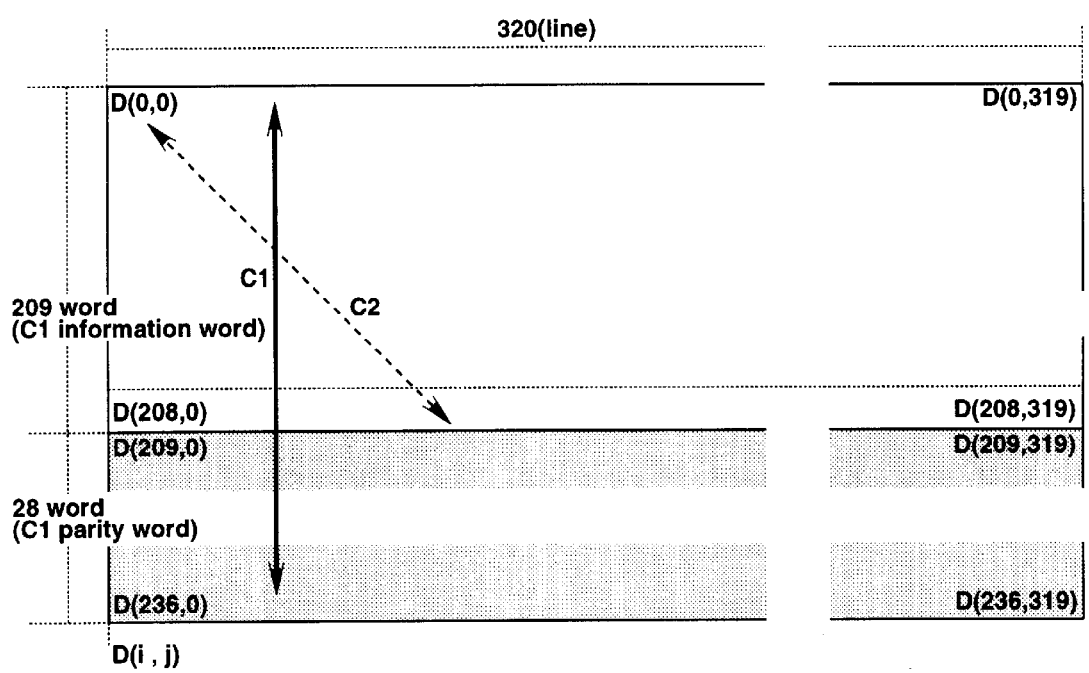
FIG. 32 shows another illustrative structure of the ECC block embodying the present invention.

The structure of the ECC block, in which the present invention is applied to the ECC block shown in FIG. 15 or to the ECC block shown in FIG. 24, is shown in FIG. 32.

Figure 33:
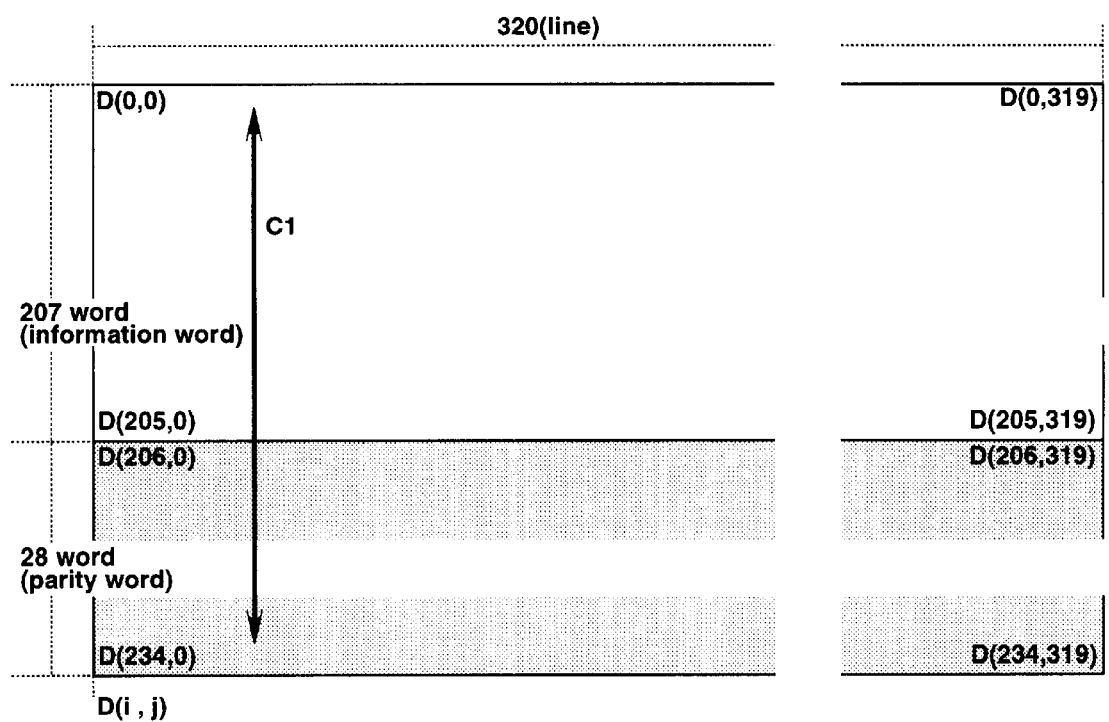
FIG. 33 shows an ECC block of the block format which is to be the basis of the ECC block shown in FIG. 32.

In the ECC block, shown in FIG. 32, the present invention is applied to an ECC block having a block format shown in FIG. 33, that is an ECC block with a code length of 235 (207 information words and 29 parity words) and an interleaving length of 320, obtained on arraying 320 lines each made up of 207 information words and a code C1 of 28 parity words to form a block. In each code length, on interleaving the direction of the second code C2 by a segment length on the data on the disc. The RS (209, 207, 3) code is constituted by the second code C2 made up of 320 codes generating the 2-word parity words and the first error correction code C1 generating the 26 parity words as the RS (235, 209, 27) code in the perpendicular axis direction, with the code length of the second code C2 as the information word length of the first code C1.

In the ECC block, shown in FIG. 32, D(i,j)/i is 0 to 234 and j is 0 to 319. In each j, the RS(235, 207, 29) code (=C1) is constituted.

Figure 34:
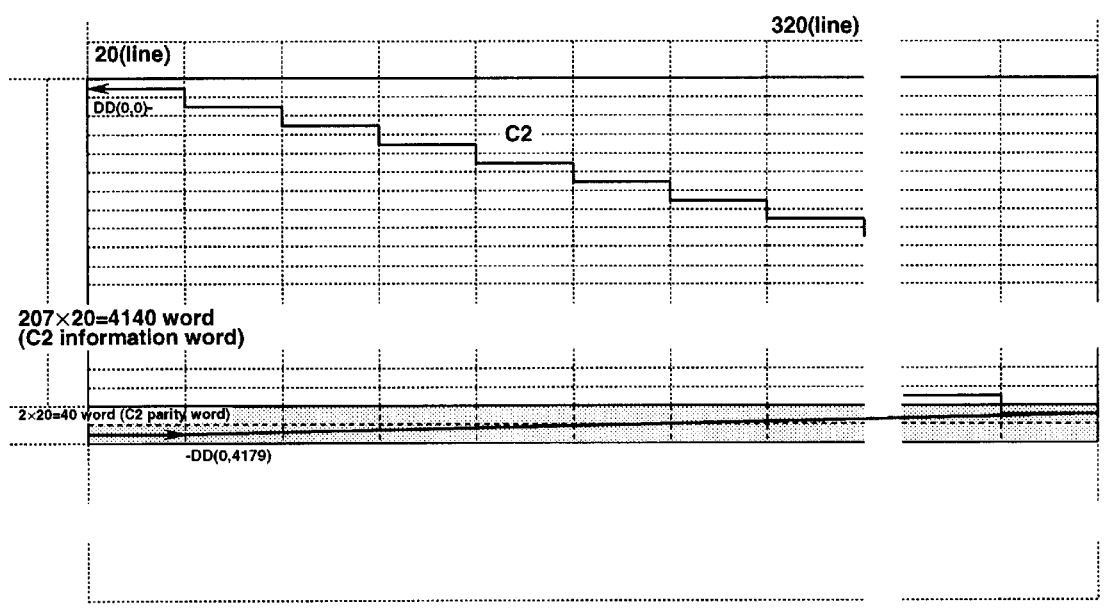
FIG. 34 shows the structure of the second code C2 in case the code length of the second code C2 is the information word length of the first correction code C1 multiplied by the segment length by applying the present invention to the ECC block shown in FIG. 32.

If, in the present invention is applied to the ECC block shown in FIG. 32, the code length of the second code C2 is the information word length of the first error correction code C1×segment length, the structure of the second code C2 is as shown in FIG. 34, in which DD(ii, jj)/ii i 0 to 4179 and jj is 0 to 15. Each jj, is made up of a sum total of 16 codes constituting the RS(4180, 4140, 41) code. In the usual correction code, employing the GF(28), the number of symbols of the codes is up to 255. However, if it is the error correction code, the second code C2 can be constituted. DD(ii, jj) is the same as the data direction on the disc.

If the present invention is applied to the ECC block shown in FIG. 32, the parity of the second code C2 may be arranged in the sector ID. In FIG. 33, DD(ii, jj) is made up of 0 to 4139 and jj is constituted by 0 to 15, with the four words in the sector ID being the parity. Each jj is the second code C2 from the sum total of 16 codes constituting the RS(4140, 4136, 5) code. The first error correction code is the same as in FIG. 32. By arranging the parity If the second code C2 in the sector ID, the parity of the first error correction code C1 is 28, with the code length being 235.

The user data for the optical disc of the above-described disc format is recorded/reproduced by an optical disc recording/reproducing apparatus shown in FIG. 17.

The user data is recorded/reproduced with the user data direction along the direction of the first error correction code C1 or along the direction of the second error correction code C2.

In the following description, it is first assumed that data is recorded/reproduced with the user data direction as the direction of the first error correction code C1.

In the usual recording mode for producing a picture on a computer, the user data sent from the application side is stored in the buffer memory 204 of the recording/reproducing processing block 200 in the direction of the first error correction code C1.

The ECC processor 205 generates the second code C2 to then generate the first error correction code.

The data in the ECC block, provided on the buffer memory 204, is read out from the buffer memory 204 in the direction of the second code C2 and RLL(1,7) modulated by the modulator 208 at the timing of the sector for recording indicated by the timing signal from the in-sector timing generator 206. The data is turned by the selector 212 into recording channel signals having appended thereto the APC, VFO, SS and PO patterns, generated by the pattern generator 211. These recording channel signals are sent to the disc drive 100 for recording on the user area in the optical disc 101. That is, the data in the ECC block is recorded on the optical disc 101 in the direction of the second code C2.

The arbitration processor 203 arbitrates the address signals for the buffer memory generated from each block to re-array the data.

Figure 35A:
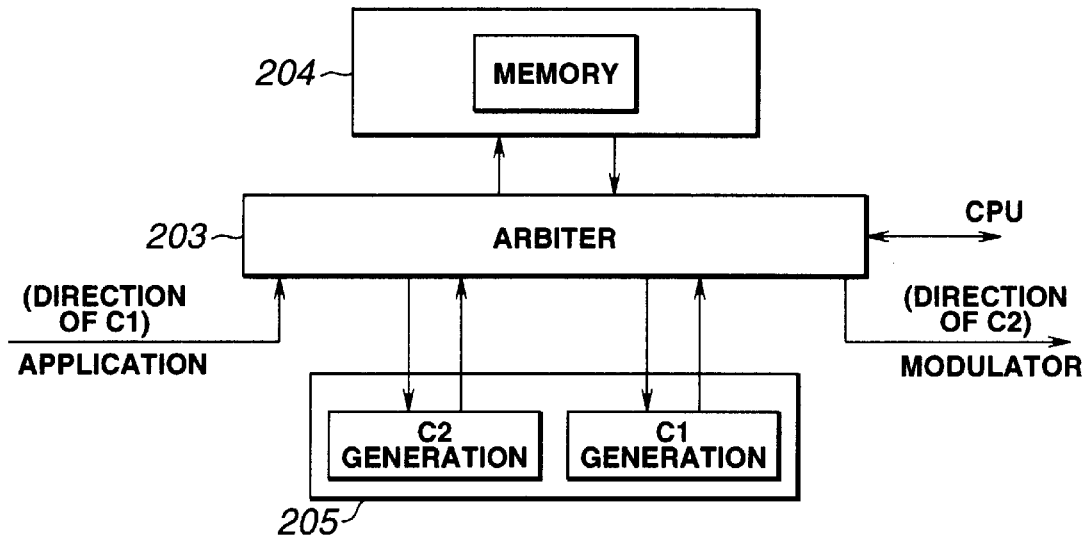
FIGS. 35A, 35B schematically show the data flow in the usual recording mode and the high-speed recording mode in case the user data direction is set to the direction of the first correction code C1 in the optical disc recording/reproducing apparatus embodying the present invention.

In this usual recording mode, three passes, that is six accessing operations to the buffer memory 204, are required in the recording/reproducing processing block 200, as shown in FIG. 35A.

In the high-speed recording mode for doing the same recording for plural pictures, as contrasted to the usual recording mode, the recording/reproducing processing block 200 stores the user data from the application side in the buffer memory 204 as the first error correction code C1 is generated by the ECC processor 205. The ECC processor 205 puts dummy data in the C2 parity area without generating the second code C2.

The data in the ECC block, provided on the buffer memory 204, is recorded on the optical disc 101 in the direction of the second code C2.

Figure 35B:
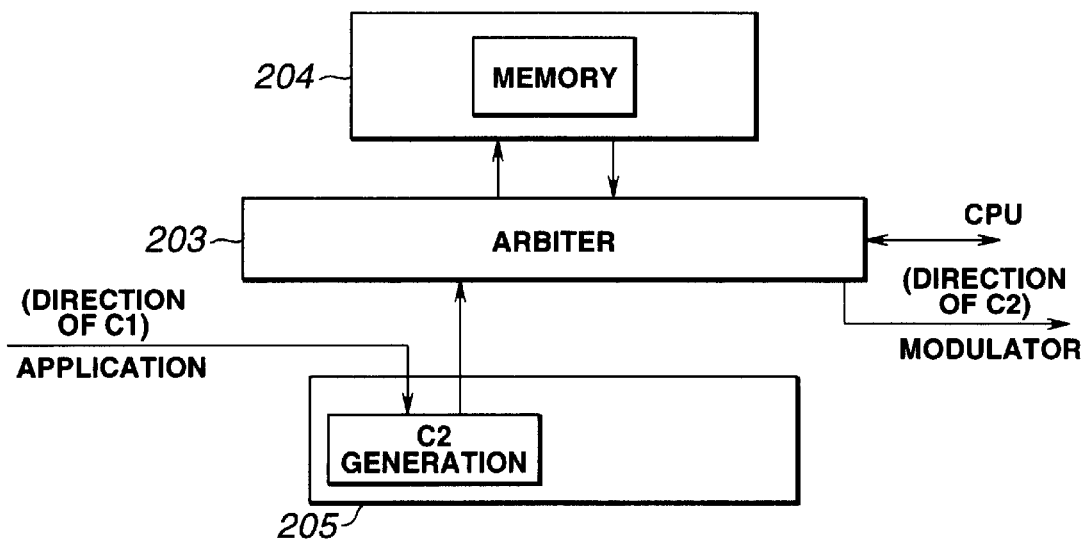

That is, in the high-speed recording mode, the operation of the recording/reproducing processing block 200 is one pass, with the accessing to the buffer memory 204 being made twice, as shown in FIG. 35B.

During the usual reproduction mode, as when editing the picture on a computer, the synchronization detector 213 detects synchronization signals from the reproduced playback channel signals to send the detected synchronization signals to the playback timing generator 207 by way of synchronization protection. Based on the timing of the playback timing generator 207, the reproduced data is RLL (1,7) demodulated and sent to the buffer memory 204. That is, the playback data, corresponding to the recorded data on the optical disc 101 in the direction of the second code C2 and reproduced in the direction of the second code C2, is sent to the buffer memory 204.

The ECC processor 205 performs error correction with the first correction code C1 and subsequently with the second code C2. In addition, the ECC processor 205 performs erasure (mixing) correction in the direction of the first code C1 and subsequently sends the user data to the application side.

Figure 36A:
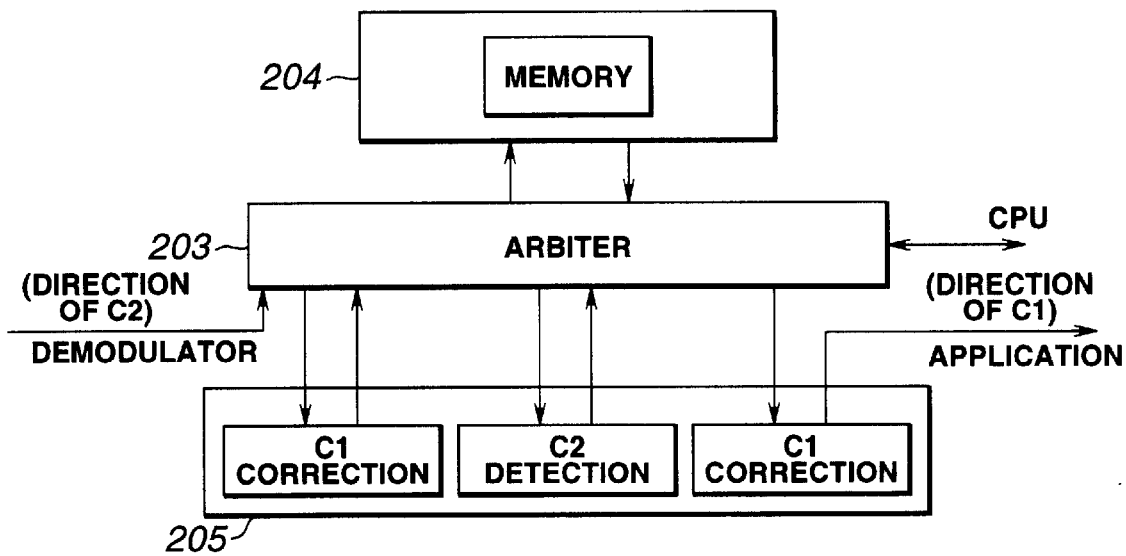
FIGS. 36A, 36B are schematic views showing the data flow in the usual reproducing mode and in the high-speed reproducing mode in case the user data direction is the direction of the first correction code C1 in the optical disc recording/reproducing apparatus embodying the present invention.

That is, in the usual payback mode, three passes, that is six accessing operations to the buffer memory 204, is required in the recording/reproducing processing block 200, as shown in FIG. 36A.

In the high-speed reproducing mode for high-speed reproduction, such as fast feed, as contrasted to the usual recording mode, the recording/reproducing processing block 200 reproduces data from the optical disc 101 in the direction of the second code C2, to send the reproduced data to the buffer memory 204.

The ECC processor 205 corrects errors with the first code C1, and then sends the user data immediately to the application side, without proceeding to error correction with the second correction code C2.

Figure 36B:
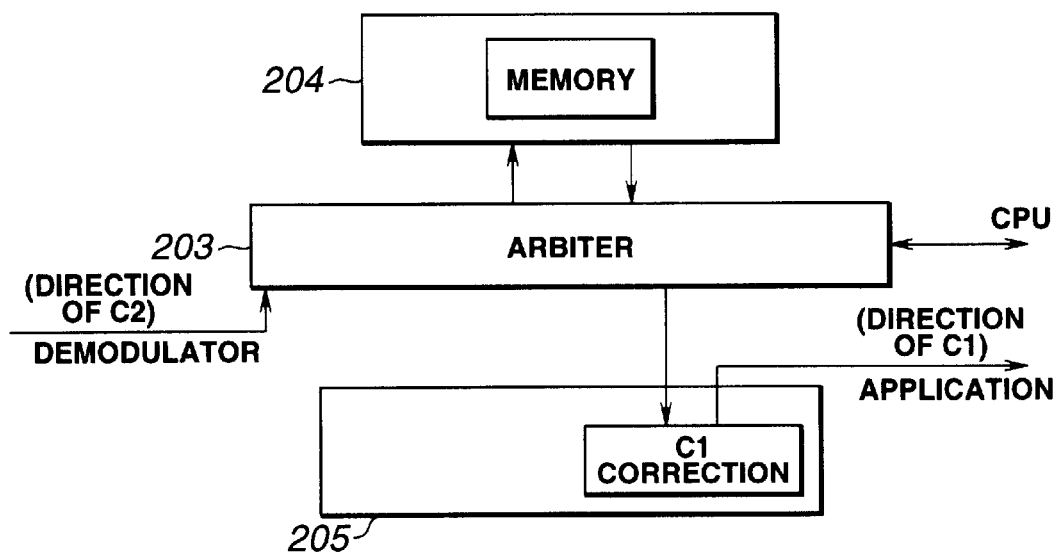

That is, in the high-speed reproducing mode, the operation of the recording/reproducing processing block 200 is one pass, with the accessing to the buffer memory 204 being made twice, as shown in FIG. 36B.

In the following description, it is assumed that the user data is recorded/reproduced with the user data direction as the direction of the second code C2.

In the recording mode, the recording/reproducing processing block 200 stores user data from the application side in the buffer memory 204 as the second code C2 is generated by the ECC processor 205.

The ECC processor 205 then generates the first error correction code C1.

The data in the ECC block, provided on the buffer memory 204, is recorded on the optical disc 101 in the direction of the second code C2.

Figure 37:
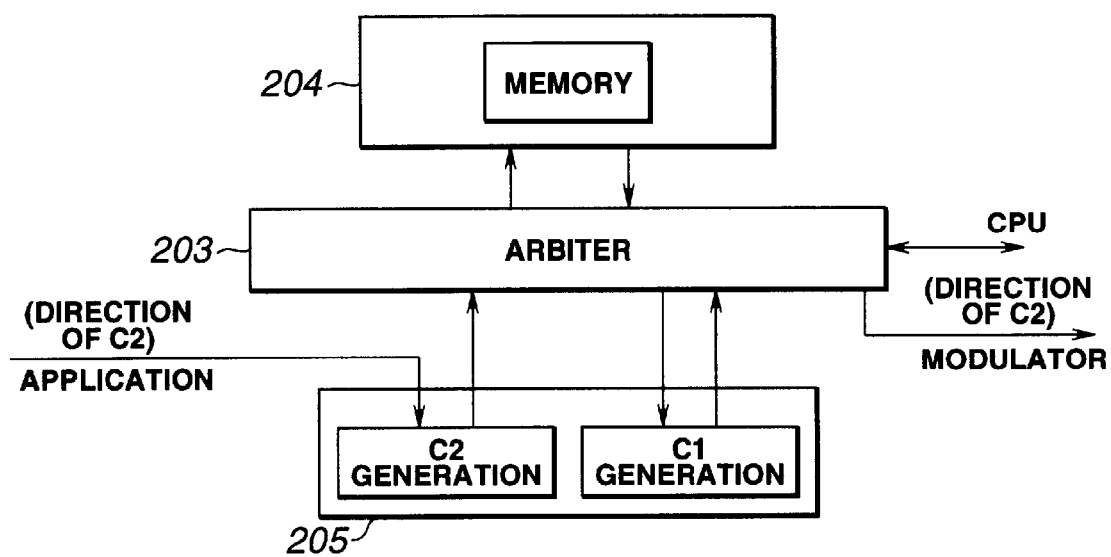
FIG. 37 is a schematic view showing the data flow in the recording mode in case the user data direction is the direction of the second correction code C2 in the optical disc recording/reproducing apparatus embodying the present invention.

In this recording mode, the operation of the recording/reproducing processing block 200 is two passes, that is four times of accessing to the buffer memory 204, as shown in FIG. 37.

Figure 38A:
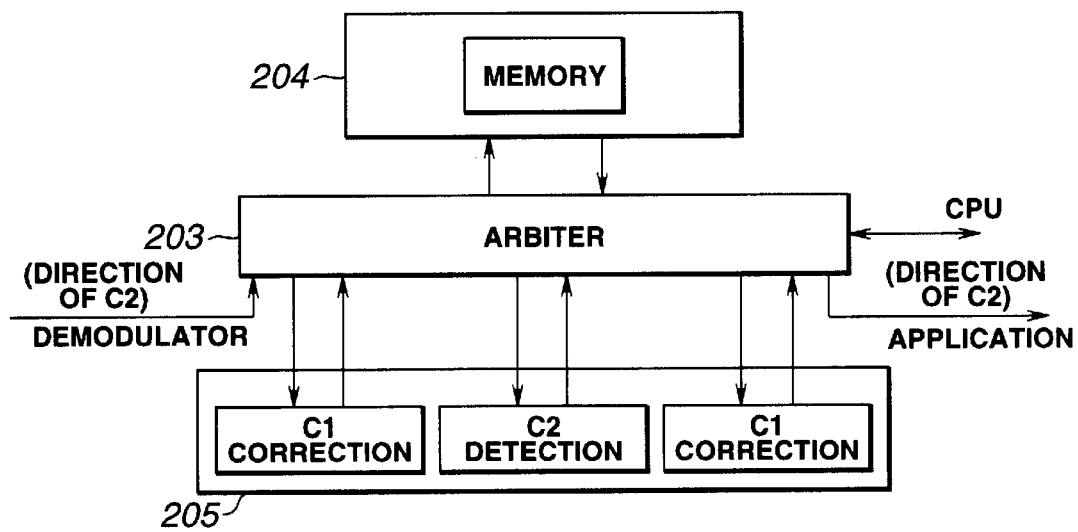
FIGS. 38A, 38B are schematic views showing the data flow in the usual reproducing mode and in the high-speed reproducing mode in case the user data direction is the direction of the second correction code C2 in the optical disc recording/reproducing apparatus embodying the present invention.

In the usual reproducing mode, the operation of the recording/reproducing processing block 200 is four passes, with the accessing to the buffer memory 204 being made eight times, as shown in FIG. 38A.

Also, in the high-speed reproducing mode, data is reproduced from the optical disc 101 in the direction of the second code C2 to send the reproduced data to the buffer memory 204.

The e205 corrects errors with the first code C1, and then sends out user data immediately to the application side, without correcting errors of the second code C2.

Figure 38B:
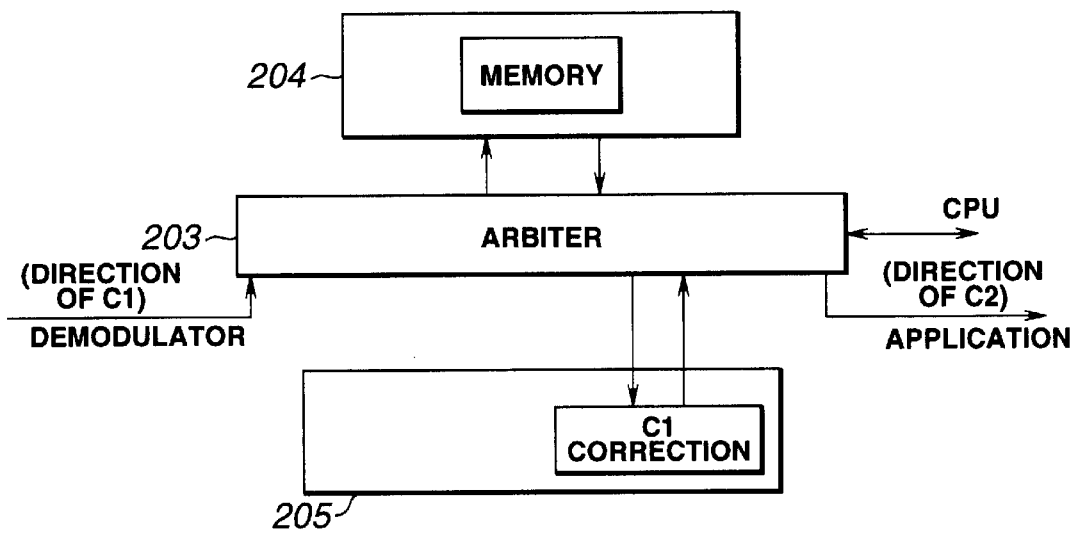

That is, in the high-speed reproducing mode, the operation of the recording/reproducing processing block 200 is one pass, with the accessing to the buffer memory 204 being made twice, as shown in FIG. 38B.

For recording, the optical disc recording/reproducing apparatus controls the direction of the user data, the parity generating sequence and the code length depending on the function to be used, and stores the control information in the file (data) management information or transmits the information. Alternatively, this control information is set in the sector ID prior to control to generate the codes. For playback, the direction of the user data, the parity generating sequence and the code length are controlled by the file (data) management information. Alternatively, the direction of the user data, the parity generating sequence and the code length may be controlled by the control information obtained from the sector ID reproducing unit. The code length may also be taken into account in the above control.

If the ECC block and the sector management parameters are adapted to be controlled, it is possible to cope with the short block size relatively easily.

Figure 39:
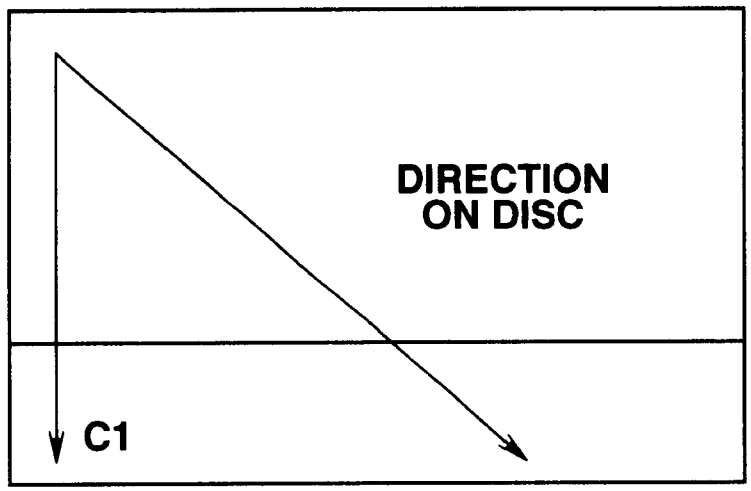
FIG. 39 schematically shows the structure of an ECC block in which the user data direction is equated to the correction code direction.
Figure 40:
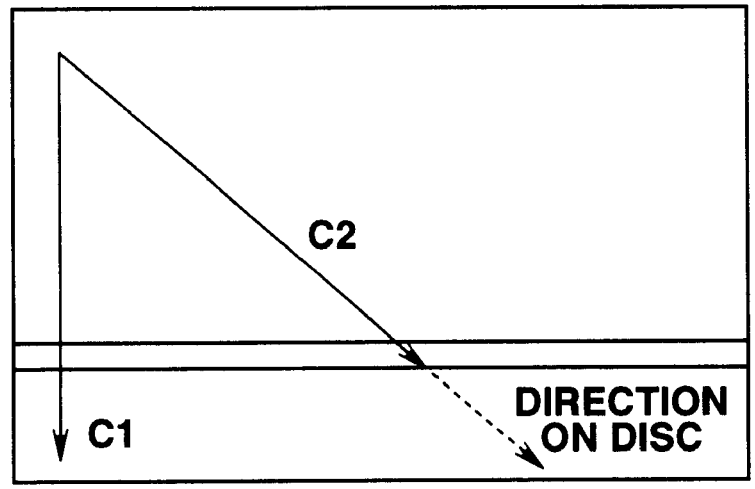
FIG. 40 shows the operating timings in an optical disc system for a conventional ECC block in which the user data direction is different from the correction code direction, an ECC block in which the user data direction is equated to the correction code direction and a conventional ECC block in which the user data direction is different from the correction code direction.

It is seen from above that, according to the present invention, the data on the disc is basically in the oblique direction, as indicated by the data direction on the disc and the code direction (correction line) in FIG. 39, whereas the error correction code C1 considers a line on the vertical axis, this error correction code C1 being interleaved and arrayed to form an ECC block, on which the second code C2 having the data direction different from the first error correction code C1 is constituted, as shown in FIG. 40.

In this ECC block, the direction of data on the disc is oblique, while the interleaving direction for the first error correction code C1 is along the horizontal axis, thus enabling the lengthening of interleaving. Moreover, in this ECC block, the product code (PCR) can be constructed by the second code C2 being the error detection code, thus assuring high correction capability. In addition, with the present ECC block, since the second code C2 has the same direction as the data direction on the disc, it is possible to start encoding as from a time point the data necessary for generating a code is in order and to record data on the disc at a time point the encoding for one ECC block comes to a close. During reproduction, the correction operation for the playback data can be started at a time point the data corresponding to a sole ECC block has been sent from the demodulator, and user data can be sent out as from a time point the correction for one code has come to a close.

What is claimed is:

1. A recording/reproducing method for an optical disc in which data is recorded/reproduced by a disc format in which an ECC block is comprised of at least one sector and is formed by a first error correction code interleaved with respect to the direction of user data on the disc and a second code having a data direction different from that of the first error correction code;

said sector is made up of a plurality of sub-sectors;
the block length of said ECC block is set so that block length=number of sectors×number of frames×frame length= code length×interleaving length;

the number of sub-sectors is set so that
number of sub-sectors=number of sectors×p, where p is the number of segments, p being a natural number;
(code length×interleaving length)/(segment length× number of sub-sectors)% number of sub-sectors, where % denotes modulo, and the number of sub-sectors, are prime relative to each other; and in which
the number of data symbols in said segment is smaller than the number of sectors in the frame, and the position of the code for correction is updated from segment to segment in associating the data position on the disc with the data position on the ECC block, as the interleaving rule is met; and
data is recorded/reproduced by said disc format in which an information word portion of the first error correction code in said ECC block comprises said second code interleaved.

2. The optical disc recording/reproducing method according to claim 1 wherein the direction of the second code is caused to coincide with the user data direction on the disc.

3. The optical disc recording/reproducing method according to claim 1 wherein the code length of said second code is the information word length of said first error correction code.

4. The optical disc recording/reproducing method according to claim 1 wherein the data is recorded/reproduced by a disc format in which the code length of said second code is such that code length of second code=information word length of the first error correction code×segment length.

5. The optical disc recording/reproducing method according to claim 1 wherein the data is recorded/reproduced by a disc format having a sector ID such that length of sector ID×number of sectors=interleaving length×k, where k is a natural number, said sector ID length being such that
length of sector ID=segment length×p, where p is the number of segments which is a natural number.

6. The optical disc recording/reproducing method according to claim 5 wherein parity of the second code is arrayed in the sector ID.

7. The optical disc recording/reproducing method according to claim 1 wherein the information word of the second code is made up only of user data or of the user data and the parity of the first error correction code, without changing block size of the ECC block.

8. An optical disc having a disc format in which an ECC block is comprised of at least one sector and is formed by a first error correction code interleaved with respect to the direction of user data on the disc and a second code having a data direction different from that of the first error correction code;

said sector is made up of a plurality of sub-sectors;
the block length of said ECC block is set so that block length=number of sectors×number of frames×frame length= code length×interleaving length;

the number of sub-sectors is set so that
number of sub-sectors=number of sectors×p, where p is the number of segments, p being a natural number;
(code length×interleaving length)/(segment length× number of sub-sectors)% number of sub-sectors, where % denotes modulo, and the number of sub-sectors, are prime relative to each other;
the number of data symbols in said segment is smaller than the number of sectors in the frame, and the position of the code for correction is updated from segment to segment in associating the data position on the disc with the data position on the ECC block, as the interleaving rule is met; and in which
the information word portion of the first error correction code in said ECC block comprises said second code interleaved.

9. The optical disc according to claim 8 wherein the direction of the second code coincides with the user data direction on the disc.

10. The optical disc according to claim 8 wherein the code length of said second code is the information word length of said first error correction code.

11. The optical disc according to claim 8 wherein the code length of said second code is such that code length of second code=information word length of the first error correction code×segment length.

12. The optical disc according to claim 8 wherein disc format has a sector ID such that length of sector ID×number of sectors=interleaving length×k, where k is a natural number, said sector ID length being such that
length of sector ID=segment length×p, where p is the number of segments which is a natural number.

13. The optical disc according to claim 12 wherein the parity of the second code is arrayed in the sector ID.

14. The optical disc according to claim 8 wherein the disc format is one in which the information word of the second code is made up only of user data or of the user data and the parity of the first error correction code, without changing block size of the ECC block.

15. Apparatus for recording/reproducing data to/from a disc by a disc format in which an ECC block is comprised of at least one sector and is formed by a first error correction code interleaved with respect to the direction of user data on the disc and a second code having a data direction different from that of the first error correction code, said apparatus comprising:

ECC block forming means for forming said ECC block according to said disc format; and recording/reproducing means for recording/reproducing said ECC block to/from said disc; and wherein, said sector is made up of a plurality of sectors;
the block length of said ECC block is set so that block length=number of sectors×number of frames×frame length=code length×interleaving length;

the number of sub-sectors is set so that number of sub-sectors=number of sectors×p, where p is the number of segments, p being a natural number;
(code length×interleaving length)/(segment length× number of sub-sectors)% number of sub-sectors, where % denotes modulo, and the number of sub-sectors, are prime relative to each other; and in which the number of data symbols in said segment is smaller than the number of sectors in the frame, and the position of the code for correction is updated from segment to segment in associating the data position on the disc with the data position on the ECC block; as the interleaving rule is met; and an information word portion of the first error correction code in said ECC block comprises said second code interleaved.

16. Apparatus according to claim 15 wherein the direction of the second code is caused to coincide with the data direction on the disc.

17. Apparatus according to claim 15 wherein the code length of said second code is the information word length of said first error correction code.

18. Apparatus according to claim 15 wherein the code length of said second code is such that code length of second code=information word length of the first error correction code×segment length.

19. Apparatus according to claim 15 wherein the disc format has a sector ID such that length of sector ID×number of sectors=interleaving length×k, where k is a natural number, said sector ID length being such that length of sector ID=segment length×p, where p is the number of segments, which is a natural number.

20. Apparatus according to claim 19 wherein the parity of the second code is arrayed in the sector ID.

21. Apparatus according to claim 15 wherein the information word of the second code is made up only of user data or of the user data and the parity of the first error correction code, without changing block size of the ECC block.

22. Apparatus according to claim 15 wherein said recording/reproducing means includes switching means for switching the user data direction to the direction of the first error correction code or to the direction of the second code.

23. Apparatus according to claim 15 wherein said recording/reproducing means includes control means for controlling the user data direction, parity generating sequence or the code length.

* * * * *